(12) United States Patent
Hamada et al.

(10) Patent No.: US 11,091,594 B2
(45) Date of Patent: Aug. 17, 2021

(54) DISPERSION COMPOSITION, CURABLE COMPOSITION, LIGHT-SHIELDING FILM, COLOR FILTER, AND SOLID-STATE IMAGING DEVICE

(71) Applicant: FUJIFILM Corporation, Tokyo (JP)

(72) Inventors: Daisuke Hamada, Shizuoka (JP); Hiroyuki Morishita, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 299 days.

(21) Appl. No.: 16/047,190

(22) Filed: Jul. 27, 2018

(65) Prior Publication Data

US 2018/0371178 A1 Dec. 27, 2018

Related U.S. Application Data

(63) Continuation of application No. PCT/JP2016/079669, filed on Oct. 5, 2016.

(30) Foreign Application Priority Data

Feb. 3, 2016 (JP) .............................. JP2016-019222

(51) Int. Cl.
| | | |
|---|---|---|
| *H01L 27/14* | (2006.01) | |
| *H04N 5/335* | (2011.01) | |
| *C08J 3/09* | (2006.01) | |
| *C08L 67/04* | (2006.01) | |
| *C08F 2/48* | (2006.01) | |
| *G02B 5/20* | (2006.01) | |
| *C09D 5/02* | (2006.01) | |
| *C09D 7/63* | (2018.01) | |
| *G03F 7/00* | (2006.01) | |
| *C08J 5/18* | (2006.01) | |
| *G02B 5/22* | (2006.01) | |
| *G02F 1/1335* | (2006.01) | |
| *C08K 5/10* | (2006.01) | |

(52) U.S. Cl.
CPC ................ *C08J 3/095* (2013.01); *C08F 2/48* (2013.01); *C08J 5/18* (2013.01); *C08L 67/04* (2013.01); *C09D 5/02* (2013.01); *C09D 7/63* (2018.01); *G02B 5/20* (2013.01); *G02B 5/223* (2013.01); *G02F 1/133512* (2013.01); *G03F 7/0007* (2013.01); *C08J 2367/04* (2013.01); *C08K 5/10* (2013.01)

(58) Field of Classification Search
CPC ......... C09D 7/63; G03F 7/0007; G03F 7/027; G03F 7/028; G03F 7/105; G02B 5/20; G02B 5/223; G02F 1/133512; G02F 1/133514; G02F 1/133516

USPC .................................. 430/7, 281.1; 106/499
See application file for complete search history.

(56) References Cited

U.S. PATENT DOCUMENTS

2005/0256247 A1  11/2005  Kano et al.
2015/0259547 A1   9/2015  Ezoe et al.

FOREIGN PATENT DOCUMENTS

| EP | 1 535 971 A1 | 6/2005 |
|---|---|---|
| EP | 2 042 921 A2 | 4/2009 |
| JP | 2004-109423 A * | 4/2004 |
| JP | 2008-69325 A | 3/2008 |
| JP | 2009096977 A | 5/2009 |
| JP | 2010-139538 A | 6/2010 |
| JP | 2011-225776 A | 11/2011 |
| JP | 2013-203825 A | 10/2013 |
| JP | 5340102 B2 | 11/2013 |
| KR | 10-2015-0072428 A | 6/2015 |
| WO | 2004000950 A1 | 12/2003 |

OTHER PUBLICATIONS

Computer-generated translation of JP 2011-225776 (Nov. 2011). (Year: 2011).*
Computer-generated translation of JP 2004-109423 (Apr. 2004). (Year: 2004).*
Notice of Final Rejection dated Jan. 20, 2020, issued by the Korean Intellectual Property Office in Application No. 10-2018-7022211.
Communication dated Aug. 9, 2019, issued by the Korean Intellectual Property Office in corresponding Korean Application No. 10-2018-7022211.
International Search Report for PCT/JP2016/079669 dated Dec. 27, 2016 [PCT/ISA/210].
Written Opinion for PCT/JP2016/079669 dated Dec. 27, 2016 [PCT/ISA/237].
International Preliminary Report on Patentability with Written Opinion dated Aug. 7, 2018, issued by the International Searching Authority in application No. PCT/JP2016/079669.
Communication dated Mar. 4, 2020 from the Taiwanese Patent Office in application No. 105137763.
Extended European Search Report dated Nov. 9, 2018 issued by the European Patent Office in counterpart application No. 16889342.8.
Notice of Reasons for Refusal dated Jul. 2, 2019 from the Japanese Patent Office in application No. 2017-565390.
Communication dated Apr. 8, 2020 from Korean Intellectual Property Office in KR Application No. 10-2018-7022211.

(Continued)

*Primary Examiner* — John A McPherson
(74) *Attorney, Agent, or Firm* — Sughrue Mion, PLLC

(57) ABSTRACT

A dispersion composition contains a pigment, a dispersant, and a cyclic or chain-like polyester compound. A curable composition contains the above-described dispersion composition. A light-shielding film, a color filter, and a solid-state imaging device contain the curable composition.

24 Claims, 4 Drawing Sheets

(56) References Cited

OTHER PUBLICATIONS

Communication dated Sep. 22, 2020, from the Taiwanese Patent Office in Application No. 105137763.
Office Action dated Jun. 10, 2021 in Taiwanese Application No. 105137763.

* cited by examiner

DISPERSION COMPOSITION, CURABLE COMPOSITION, LIGHT-SHIELDING FILM, COLOR FILTER, AND SOLID-STATE IMAGING DEVICE

CROSS-REFERENCE TO RELATED APPLICATIONS

This application is a Continuation of PCT International Application No. PCT/JP2016/079669, filed on Oct. 5, 2016, which claims priority under 35 U.S.C. § 119(a) to Japanese Patent Application No. 2016-019222, filed on Feb. 3, 2016. Each of the above application(s) is hereby expressly incorporated by reference, in its entirety, into the present application.

BACKGROUND OF THE INVENTION

1. Field of the Invention

The present invention relates to a dispersion composition, a curable composition, a light-shielding film, a color filter, and a solid-state imaging device.

2. Description of the Related Art

The solid-state imaging device includes a taking lens, a solid-state imaging element such as a charge coupled element (CCD) and a complementary metal oxide film semiconductor (CMOS), which is disposed behind the taking lens, and a circuit board on which the solid-state imaging element is mounted. This solid-state imaging device is loaded on a digital camera, a camera-equipped mobile phone, a smartphone, and the like.

In the solid-state imaging device, noise may be generated due to reflection of visible light. In view of this, in JP5340102B, a predetermined light-shielding film is provided in the solid-state imaging device, thereby suppressing generation of noise. As a composition for forming the light-shielding film, a polymerizable composition containing a black pigment such as titanium black is used.

In order to improve dispersibility of the black pigment such as titanium black, a dispersant is used. JP5340102B discloses a dispersion composition containing titanium black, a graft copolymer as a dispersant, and a solvent, and a polymerizable composition containing the dispersion composition, a polymerization initiator, and a polymerizable compound.

SUMMARY OF THE INVENTION

On the other hand, in recent years, with miniaturization, thinning, and enhanced sensitivity of the solid-state imaging device, further improvement in performance of the light-shielding film has been required.

Under such circumstances, the present inventors prepared a dispersion composition based on the description of JP5340102B, and produced a light-shielding film with a polymerizable composition (curable composition) obtained by using this dispersion composition. At that time, the present inventors found that a light-shielding film produced by using the dispersion composition after a long-term storage has changed spectral absorption characteristics as compared with a light-shielding film produced by using the dispersion composition immediately after preparation, and there is still room for improvement in performance stability.

That is, it became clear that storage stability of the dispersion composition needs to be further improved.

In view of the above circumstances, an object of the present invention is to provide a dispersion composition having excellent storage stability.

Another object of the present invention is to provide a curable composition containing the above-described dispersion composition, a light-shielding film, a color filter, and a solid-state imaging device.

The present inventors have performed intensive studies to address the above problems, and, as a result, have found that the above problems can be solved by using a cyclic or chain-like polyester compound.

That is, the present inventors have found that the above objects can be achieved by the following constitution.

(1) A dispersion composition comprising a pigment, a dispersant, and a cyclic or chain-like polyester compound.

(2) The dispersion composition according to (1), further comprising a solvent.

(3) The dispersion composition according to (1) or (2), in which the cyclic or chain-like polyester compound has a molecular weight of equal to or greater than 500 and less than 4,000.

(4) The dispersion composition according to any one of (1) to (3), in which the cyclic or chain-like polyester compound contains a plurality of structural units having an ester structure, and a total of molecular weights of the plurality of structural units having an ester structure is 80% by mass or more with respect to the entire molecular weight.

(5) The dispersion composition according to any one of (1) to (4), in which the cyclic or chain-like polyester compound is represented by General Formula (1) as described later or General Formula (2) as described later, and a content thereof is 0.001% to 5% by mass with respect to the entire mass of the dispersion composition.

(6) The dispersion composition according to any one of (1) to (5), in which the cyclic or chain-like polyester compound is contained in an amount of 0.005% to 20% by mass with respect to the dispersant.

(7) The dispersion composition according to any one of (2) to (6), in which the solvent includes a solvent having a cyclic structure.

(8) The dispersion composition according to (7), in which the solvent is cyclopentanone.

(9) A curable composition comprising the dispersion composition according to any one of (1) to (8), a polymerizable compound, and a polymerization initiator.

(10) A light-shielding film comprising a cured film formed by using the curable composition according to (9).

(11) A color filter having a colored pattern formed by using the curable composition according to (9).

(12) A solid-state imaging device comprising a cured film formed by using the curable composition according to (9).

According to the present invention, it is possible to provide a dispersion composition having excellent storage stability.

Further, according to the present invention, it is possible to provide a curable composition containing the above-described dispersion composition, a light-shielding film, a color filter, and a solid-state imaging device.

DESCRIPTION OF THE PREFERRED EMBODIMENTS

Figure 1:
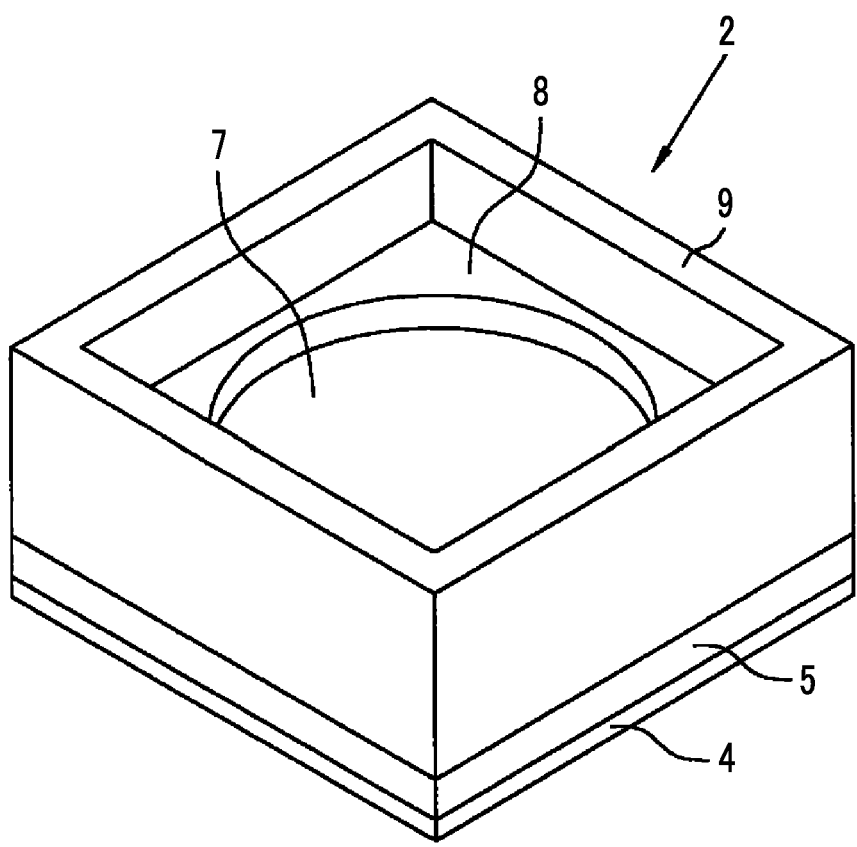
FIG. 1 is a perspective view showing a solid-state imaging device according to a first embodiment.

Hereinafter, suitable embodiments of the dispersion composition, the curable composition, the light-shielding film, the color filter, and the solid-state imaging device of the present invention will be described in detail.

In the present specification, in a case where a group (atomic group) is indicated without specifying whether it is substituted or unsubstituted, it includes a group having a substituent as well as a group having no substituent. For example, an "alkyl group" includes not only an alkyl group having no substituent (unsubstituted alkyl group) but also an alkyl group having a substituent (substituted alkyl group).

In the present specification, a "radiation" means to include visible rays, ultraviolet rays, far ultraviolet rays, electron beams, X rays, and the like.

Description of the constituent requirements described below may be made on the basis of representative embodiments of the present invention. However, the present invention is not limited to such embodiments. Also, a numerical range expressed by using a preposition "to" in the present specification means a range including numerical values described before and after the preposition "to" as a lower limit and an upper limit, respectively.

In the present specification, "(meth)acrylate" refers to acrylate and methacrylate; "(meth)acrylic" refers to acrylic and methacrylic; "(meth)acryloyl" refers to acryloyl and methacryloyl; and "(meth)acrylamide" refers to acrylamide and methacrylamide. In the present invention, a monomer is distinguished from an oligomer and a polymer, and refers to a compound having a weight average molecular weight of 2,000 or less. In the present specification, a polymerizable compound refers to a compound having a polymerizable group, and may be a monomer or a polymer. The polymerizable group refers to a group involved in a polymerization reaction.

[Dispersion Composition]

The dispersion composition of the present invention contains a pigment, a dispersant, and a cyclic or chain-like polyester compound.

A feature of the dispersion composition of the present invention includes using the above-described cyclic or chain-like polyester compound.

The present inventors have now found that a light-shielding film produced by using a dispersion composition after a long-term storage, which uses a cyclic or chain-like polyester compound, exhibits the same spectral absorption characteristics as a light-shielding film produced by using the dispersion composition immediately after preparation.

Further, the present inventors have confirmed that in a case where a dispersion composition containing a pigment and a dispersant is stored at a low temperature (−30° C. to 10° C.) for a long period and a curable composition containing the dispersion composition is used to produce a light-shielding film, foreign matters may be generated in the light-shielding film due to precipitation of the dispersant. The present inventors have considered that the above-described cyclic or chain-like polyester compound also has an effect of suppressing generation of foreign matters (in other words, a dispersion composition containing the cyclic or chain-like polyester compound has storage stability at low temperature).

Factors causing the above effect are not clear, but are presumed as follows.

It is considered that in a case where a cyclic or chain-like polyester compound, which is a hydrophobic low-molecular-weight component, is added in a dispersion composition containing a pigment and a dispersant, the cyclic or chain-like polyester compound causes an interaction (stacking) with a hydrophobic component in a structure of the dispersant, and thus hydrophobicity of the dispersant adsorbing to the pigment is improved, so that a temporal sedimentation-suppressing effect is exerted. In addition, at the same time, the dispersant which is easily precipitable and the cyclic or chain-like polyester compound are mixed to exert also a precipitation-suppressing effect at low temperature.

In particular, in a case where a structural skeleton of a hydrophobic group in the dispersant is a polyester structure similar to that of the cyclic or chain-like polyester compound, the interaction (stacking) becomes stronger and the effect of the present invention is more excellent.

A content of the cyclic or chain-like polyester compound in the dispersion composition is preferably adjusted within a specific range from the viewpoint of suppressing an interaction between the cyclic or chain-like polyester compounds and improving dispersion stability thereof.

Furthermore, it has been confirmed that in a case where the dispersion composition contains a solvent having a cyclic structure (in particular, cyclopentanone), generation of foreign matters is further suppressed.

In a case where a polar group is contained in the solvent having a cyclic structure, the solvent easily takes a structure in which the polar group three-dimensionally protrudes, as compared with a chain-like solvent. Furthermore, in the solvent having a cyclic structure, in a case where a hydrophobic portion has a cyclic structure, a volume of the hydrophobic portion becomes small. That is, density increases with respect to the hydrophobic component contained in the composition. Accordingly, it is considered that solubility of the hydrophobic group of the dispersant and the cyclic or chain-like polyester compound is improved, and it is presumed that generation of foreign matters is further suppressed.

The respective components of the dispersion composition of the present invention will be first described in detail below.

<Pigment>

As a pigment, for example, in a case of being used for manufacturing a color filter, it is possible to use a chromatic color-based pigment (chromatic color pigment) such as R (red), G (green), or B (blue) which forms a color pixel of a color filter. In addition, it is also possible to use a black-based pigment (black pigment) generally used for forming a black matrix or for forming a light-shielding film system.

(Chromatic Color-Based Pigment)

As a chromatic color-based pigment, various inorganic pigments or organic pigments known in the related art can be used. In addition, the chromatic color-based pigment is preferably as fine as possible in that it exhibits high transmittance properties. Among these, in consideration of handleability, an average primacy particle diameter of the chromatic color-based pigment is preferably 0.01 μm to 0.1 μm, and more preferably 0.01 μm to 0.05 μm.

The average primary particle diameter of the pigment can be measured using a transmission electron microscope (TEM). As the transmission electron microscope, for example, a transmission type microscope HT7700 manufactured by Hitachi High-Technologies Corporation can be used.

A maximum length (Dmax: maximum length at two points on an outline of a particle image) of the particle image obtained by using a transmission electron microscope and a vertical length to the maximum length (DV-max: shortest length vertically connecting two straight lines parallel to the maximum length in a case where the image is interposed between the two straight fines) were measured and a geometric mean value thereof $(Dmax \times DV\text{-}max)^{1/2}$ was taken as a particle diameter. By using this method, particle diameters of 100 particles were measured, and an arithmetic mean value thereof was taken as the average primary particle diameter of the pigment. An "average primary particle diameter" in the examples of the present specification is also the same as the above-mentioned arithmetic mean value.

Examples of the inorganic pigment can include a metal compound represented by a metal oxide or a metal complex salt. Specific examples thereof can include oxides of metals such as iron, cobalt, aluminum, cadmium, lead, copper, titanium, magnesium, chromium, zinc, and antimony, and complex oxides of the above metals.

Examples of the organic pigment can include the following. However, the present invention is not limited thereto.

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, or the like, C.I. Pigment Orange 2, 5, 13, 16, 17:1, 31, 34, 36, 38, 43, 46, 48, 49, 51, 52, 55, 59, 60, 61, 62, 64, 71, 73, or the like, C.I. Pigment Red 1, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, or 279, C.I. Pigment Green 7, 10, 36, 37, 58, or 59, C.I. Pigment Violet 1, 19, 23, 27, 32, 37, or 42, C.I. Pigment Blue 1, 2, 15, 15:1, 15:2, 15:3, 15:4, 15:6, 16, 22, 60, 64, 66, 79, or 80.

These organic pigments can be used alone or in various combinations thereof in order to increase color purity.

(Black Pigment)

In the present invention, it is also possible to use a black pigment as the pigment. Hereinafter, the black pigment will be described in more detail.

As the black pigment, various known black pigments can be used. In particular, from the viewpoint of realizing a high optical density in a small amount, carbon black, titanium black, titanium oxide, iron oxide, manganese oxide, graphite, and the like are preferable, and, among these, at least one of carbon black or titanium black is more preferable. In particular, from the viewpoint of little absorption in a light absorption wavelength range of a polymerization initiator in connection with curing efficiency by exposure, titanium black is still more preferable. Specific examples of carbon black include organic pigments such as C.I. Pigment Black 1 and inorganic pigments such as C.I. Pigment Black 7, which are commercial products.

(Other Pigments)

In the present invention, as the pigment, in addition to the pigments as described above, a pigment having infrared ray absorbability can also be used.

As the pigment having infrared ray absorbability, a tungsten compound, a metal boride, and the like are preferable, and, among these, a tungsten compound is more preferable from the viewpoint of excellent light-shielding properties at wavelengths in an infrared ray region. In particular, from the viewpoint of excellent light-transmitting properties in a light-absorbing wavelength range and a visible light region of a polymerization initiator in connection with curing efficiency by exposure, a tungsten compound is further preferable.

Two or more of these pigments may be used in combination, or they may be used in combination with a dye. In order to adjust a tint and to improve light-shielding properties in a desired wavelength range, for example, an embodiment, in which a black pigment or a pigment having infrared ray shielding properties is mixed with a chromatic pigment or dye such as red, green, yellow, orange, violet, and blue as described above, is used. It is preferable to mix a black pigment or a pigment having infrared ray shielding properties with a red pigment or dye, or a violet pigment or dye, and it is more preferable to mix a black pigment or a pigment having infrared ray shielding properties with a red pigment.

(Dye)

Dyes that can be used in combination with the pigment are not particularly limited, and, for examples, colorants described in JP1989-90403A (JP-S64-90403A), JP1989-91102A (JP-S64-91102), JP1989-94301A (JP-H1-94301A), JP1994-11614A (JP-H6-11614A), JP2592207B, U.S. Pat. Nos. 4,808,501A, 5,667,920A, 505,950A, JP1993-333207A (JP-H5-333207A), JP1994-35183A (JP-H6-35183A), JP1994-51115A (JP-H6-51115A), JP1994-194828A (JP-H6-194828A), and the like can be used. In a case of being categorized as a chemical structure, a pyrazole azo compound, a pyrromethene compound, an aniline azo compound, a triphenylmethane compound, an anthraquinone compound, a benzylidene compound, an oxonol compound, a pyrazolotriazole azo compound, a pyridine azo compound, a cyanine compound, a phenothiazine compound, a pyrrolopyrazole azomethine compound, and the like can be used. In addition, as the dye, a colorant multimer may be used. Examples of the colorant multimer include compounds described in JP2011-213925A and JP2013-041097A.

The black pigment preferably contains titanium black.

Titanium black is a black particle containing a titanium atom. Preferred examples thereof include low-order titanium oxide and titanium oxynitride. In titanium black, it is possible to modify a surface thereof as necessary for the purpose of improving dispersibility and suppressing aggregating properties. In addition, it is possible to coat titanium black with silicon oxide, titanium oxide, germanium oxide, aluminum oxide, magnesium oxide, or zirconium oxide. Furthermore, it is also possible to subject titanium black to a surface treatment with a water repellent material as shown in JP2007-302836A.

A specific surface area of titanium black is not particularly limited, and, in order to allow water repellency of titanium black after surface treatment thereof with a water repellent agent to become a predetermined performance, a value measured by the Brunauer, Emmett, and Teller (BET)

method is preferably 5 m²/g or more and 150 m²/g or less, and more preferably 20 m²/g or more and 120 m²/g or less.

Examples of commercial products of titanium black include TITANIUM BLACK 10S, 12S, 13R, 13M, 13M-C, 13R, 13R-N, 13M-T (all trade names, manufactured by Mitsubishi Materials Corporation), and Tilack D (trade name, manufactured by Ako Kasei Co., Ltd.).

Furthermore, it is also preferable to contain titanium black as a dispersed body containing titanium black and Si atoms.

In this embodiment, titanium black is contained as a dispersed body in a composition, and a content ratio of Si atoms to Ti atoms (Si/Ti) in the dispersed body is, in terms of mass, preferably 0.05 or more, more preferably 0.05 to 0.5, and still more preferably 0.07 to 0.4.

Here, the dispersed body includes both one in which titanium black is in a state of primary particles and one in which titanium black is in a state of aggregates (secondary particles).

In order to change the Si/Ti of the dispersed body (for example, to be 0.05 or more), the following means can be used.

By first dispersing titanium oxide and silica particles using a disperser to obtain a dispersion, and subjecting the dispersion to a reduction treatment at a high temperature (for example, 850° C., to 1,000° C.), it is possible to obtain a dispersed body containing Si and Ti in which titanium black particles are a main component. The above reduction treatment can also be performed in an atmosphere of a reducing gas such as ammonia.

Examples of the titanium oxide include TTO-51N (trade name: manufactured by Ishihara Sangyo Kaisha, Ltd.).

Examples of commercial products of silica particles include AEROSIL® 90, 130, 150, 200, 255, 300, and 380 (all trade names: manufactured by Evonik).

For dispersing titanium oxide and silica particles, a dispersant may be used. Examples of the dispersant include those described in a section of the dispersant as described later.

The above dispersion may be carried out in a solvent. Examples of the solvent include water and an organic solvent. Those described in a section of the organic solvent as described later are mentioned.

Titanium black whose Si/Ti is, for example, adjusted to 0.05 or more, can be, for example, produced by the method described in paragraph number [0005] and paragraph numbers [0016] to [0021] of JP2008-266045A.

By adjusting the content ratio (Si/Ti) of Si atoms to Ti atoms in the dispersed body containing titanium black and Si atoms to a suitable range (for example, 0.05 or more), in a case where a composition containing this dispersed body is used to form a light-shielding film, residues derived from the composition are reduced outside a region forming the light-shielding film. The residues contain components derived from the composition such as titanium black particles and resin components.

Although the reason why the residues are reduced is unknown, it is presumed that the dispersed body as described above tends to have a small particle diameter (for example, particle diameter of 30 nm or less), and a content of Si atoms in this dispersed body also increases, so that adsorbability of the entire film to an underlying base is reduced and this contributes to improvement of removability by development of an uncured composition (in particular, titanium black) in the formation of the light-shielding film.

Further, since titanium black is excellent in light-shielding properties against light in a wavelength range over a wide range from ultraviolet light to infrared light, a light-shielding film formed by using the above-mentioned dispersed body containing titanium black and Si atoms (preferably one in which Si/Ti is 0.05 or more in terms of mass) exhibits excellent light-shielding properties.

The content ratio (Si/Ti) of Si atoms to Ti atoms in the dispersed body can be measured, for example, by using the method (1-1) or method (1-2) described in paragraph number 0033 of JP2013-249417A.

Further, with respect to a dispersed body contained in the light-shielding film obtained by curing the composition, in determining whether the content ratio (Si/Ti) of Si atoms to Ti atoms in the dispersed body is 0.05 or more, the method (2) described in paragraph number 0035 of JP2013-249417A is used.

In the dispersed body containing titanium black and Si atoms, as titanium black, those as described above can be used.

Further, in this dispersed body, for the purpose of adjusting dispersibility, coloring properties, and the like, black pigments formed of a composite oxide such as Cu, Fe, Mn, V, or Ni, cobalt oxide, iron oxide, carbon black, aniline black, and the like may be used alone or in combination of two or more thereof, together with titanium black, as the dispersed body.

In this case, it is preferable that a dispersed body composed of titanium black accounts for 50% by mass or more of the entire dispersed body.

Further, in this dispersed body, for the purpose of adjusting light-shielding properties or the like, as long as an effect of the present invention is not impaired, other colorants (organic pigments or dyes, or the like) may be used in combination with titanium black as desired.

Hereinafter, materials used for introducing Si atoms into the dispersed body will be described. In a case of introducing Si atoms into the dispersed body, a Si-containing substance such as silica may be used.

Examples of silica that can be used can include precipitated silica, fumed silica, colloidal silica, and synthetic silica, which may be appropriately selected and used.

Furthermore, in a case where a particle diameter of silica particles is smaller than a film thickness of the light-shielding film, since more excellent light-shielding properties are obtained, it is preferable to use fine particle-type silica as the silica particles. Examples of the fine particle-type silica include silica described in paragraph number 0039 of JP2013-249417A, the contents of which are incorporated herein.

Further, as the pigment, a tungsten compound and/or a metal boride can also be used.

Hereinafter, the tungsten compound and the metal boride will be described in detail.

The dispersion composition of the present invention can use the tungsten compound and/or the metal boride.

The tungsten compound and the metal boride are an infrared ray shielding material which exhibits high absorption for infrared rays (light having a wavelength of about 800 to 1200 nm) (that is, has high light-shielding properties (shielding properties) against infrared rays) and exhibits low absorption for visible light. Therefore, by containing the tungsten compound and/or the metal boride, the dispersion composition of the present invention can form a pattern which exhibits high light-shielding properties in an infrared region and exhibits high light-transmitting properties in a visible light region.

Further, the tungsten compound and the metal boride also exhibit low absorption for light of shorter wavelength than a visible region which is used for exposure by a high-pressure mercury lamp, KrF, ArF, or the like used for image formation. Therefore, by combining with a polymerizable compound, an alkali-soluble resin, and a photopolymerization initiator which will be described later, excellent pattern formation properties can be obtained and development residues can be further suppressed in pattern formation.

Examples of the tungsten compound can include a tungsten oxide-based compound, a tungsten boride-based compound, and a tungsten sulfide-based compound, and a tungsten oxide-based compound represented by General Formula (composition formula) (1) is preferable.

$$M_xW_yO_z \quad (1)$$

M represents a metal, W represents tungsten, and O represents oxygen.

$$0.001 \leq x/y \leq 1.1$$

$$2.2 \leq z/y \leq 3.0$$

Examples of the metal of M include an alkali metal, an alkaline earth metal, Mg, Zr, Cr, Mn, Fe, Ru, Co, Rh, Ir, Ni, Pd, Pt, Cu, Ag, Au, Zn, Cd, Al, Ga, In, Tl, Sn, Pb, Ti, Nb, V, Mo, Ta, Re, Be, Hf, Os, and Bi, and an alkali metal is preferable. The metal of M may be one or two or more.

M is preferably the alkali metal, more preferably Rb or Cs, and still more preferably Cs.

In a case where x/y is 0.001 or more, it is possible to sufficiently shield infrared rays, and in a case where it is 1.1 or less, it is possible to more reliably prevent an impurity phase from being generated in the tungsten compound.

In a case where z/y is 2.2 or more, it is possible to further improve chemical stability of the compound as a material, and in a case where it is 3.0 or less, it is possible to sufficiently shield infrared rays.

Specific examples of the tungsten oxide-based compound represented by General Formula (1) can include $Cs_{0.33}WO_3$, $Rb_{0.33}WO_3$, $K_{0.33}WO_3$, and $Ba_{0.33}WO_3$ and $Cs_{0.33}WO_3$ or $Rb_{0.33}WO_3$ is preferable, and $Cs_{0.33}WO_3$ is more preferable.

The tungsten compound is preferably fine particles. An average particle diameter of the tungsten fine particles is preferably 800 nm or less, more preferably 400 nm or less, and still more preferably 200 nm or less. In a case where the average particle diameter thereof is in such a range, since the tungsten fine particles hardly block visible light by light scattering, it is possible to obtain more reliable light-transmitting properties in a visible light region. From the viewpoint of avoiding light scattering, the average particle diameter of the tungsten fine particles is preferably as small as possible, but it is usually 1 nm or more for reasons such as ease of handling during manufacturing.

Further, two or more of the tungsten compounds can be used.

The tungsten compound is available as a commercial product. However, in a case where the tungsten compound is, for example, a tungsten oxide-based compound, the tungsten oxide-based compound can be obtained by a method of subjecting a tungsten compound to a heat treatment in an inert gas atmosphere or a reducing gas atmosphere (see JP40962059).

Further, the tungsten oxide-based compound is, for example, also available as a dispersion of tungsten fine particles such as YMF-02 manufactured by Sumitomo Metal Mining Co., Ltd.

Further, examples of the metal boride can include one or two or more of lanthanum boride ($LaB_6$), praseodymium boride ($PrB_6$), neodymium boride ($NdB_6$), cerium boride ($CeB_6$), yttrium boride ($YB_6$), titanium boride ($TiB_2$), zirconium boride ($ZrB_2$), hafnium boride ($HfB_2$), vanadium boride ($VB_2$), tantalum boride ($TaB^2$), chromium boride (CrB, $CrB_2$), molybdenum boride ($MoB_2$, $Mo_2B_5$, MoB), and tungsten boride ($W_2B_5$), and lanthanum boride ($LaB_6$) is preferable.

The metal boride is preferably fine particles. An average particle diameter of the metal boride fine particles is preferably 800 nm or less, more preferably 300 nm or less, and still more preferably 100 nm or less. In a case where the average particle diameter thereof is in such a range, since the metal boride fine particles hardly block visible light by light scattering, it is possible to obtain more reliable light-transmitting properties in a visible light region. From the viewpoint of avoiding light scattering, the average particle diameter of the metal boride fine particles is preferably as small as possible, but it is usually 1 nm or more for reasons such as ease of handling during manufacturing.

Further, two or more of the metal borides can be used.

Metal borides are available as commercial products, and are, for example, also available as a dispersion of metal boride fine particles such as KHF-7 manufactured by Sumitomo Metal Mining Co., Ltd.

Furthermore, the dispersion composition of the present invention may contain an extender pigment as necessary. Examples of such extender pigment can include barium sulfate, barium carbonate, calcium carbonate, silica, basic magnesium carbonate, alumina white, gloss white, titanium white, and hydrotalcite. These extender pigments can be used alone or in admixture of two or more thereof. The amount used of the extender pigment is usually 0 to 100 parts by mass, preferably 5 to 50 parts by mass, and more preferably 10 to 40 parts by mass, with respect to 100 parts by mass of the colorant. In the present invention, the colorant and extender pigment can be used by modifying their surface with a polymer as the case may be.

A content of the black pigment in the dispersion composition is preferably 20% to 80% by mass, more preferably 30% to 70% by mass, and still more preferably 35% to 60% by mass, with respect to the entire solid content in the composition.

<Dispersant>

The dispersion composition of the present invention contains a dispersant. The dispersant contributes to improving dispersibility of the pigment such as titanium black as described above.

As the dispersant, for example, a known pigment dispersant can be appropriately selected and used. Among these, a polymer compound is preferable.

Examples of the dispersant can include a polymer dispersant [for example, polyamide amine and a salt thereof, a polycarboxylic acid and a salt thereof, a high molecular weight unsaturated acid ester, a modified polyurethane, a modified polyester, a modified poly(meth)acrylate, a (meth) acrylic copolymer, naphthalene sulfonic acid formalin condensate, polyoxyethylene alkyl phosphoric acid ester, polyoxyethylene alkyl amine, and pigment derivatives].

The polymer compound can be further classified into a linear polymer, a terminal-modified polymer, a graft-type polymer, and a block-type polymer, depending on a structure thereof.

The polymer compound is adsorbed on a surface of a dispersed body such as a pigment, and thus acts to prevent reaggregation of the dispersed body. Therefore, examples of those having a preferable structure can include a terminal-modified polymer, a graft-type polymer, and a block-type polymer, each having an anchor site to a surface of the pigment.

On the other hand, by modifying a surface of a dispersed body such as a pigment (for example, titanium black), it is also possible to promote adsorbability of the polymer compound thereto.

The polymer compound preferably has a structural unit having a graft chain. In this specification, the "structural unit" has the same meaning as "repeating unit".

Since a polymer compound having a structural unit having such graft chain has an affinity with a solvent due to the graft chain, it is excellent in dispersibility of the pigment and in dispersion stability of the composition after lapse of time. In addition, due to presence of a graft chain in a dispersant, the dispersant has affinity with a polymerizable compound or other resin that can be used in combination. Thus, residues are hardly generated in alkali development.

As the graft chain becomes longer, a steric repulsion effect increases and dispersibility of the pigment is improved. On the other hand, in a case where the graft chain is too long, adsorptivity thereof to the pigment decreases and dispersibility of the pigment tends to decrease. Therefore, in the graft chain, the number of atoms excluding hydrogen atoms is preferably in a range of 40 to 10,000; the number of atoms excluding hydrogen atoms is more preferably 50 to 2,000; and the number of atoms excluding hydrogen atoms is still more preferably 60 to 500.

Here, the graft chain refers to a portion from a base of a main chain of a copolymer (atom bonded to the main chain in a group branched from the main chain) to a terminal of a group branched from the main chain.

The graft chain preferably has a polymer structure. Examples of such polymer structure can include a poly (meth)acrylate structure (for example, a poly(meth)acrylic structure), a polyester structure, a polyurethane structure, a polyurea structure, a polyamide structure, and a polyether structure, and a polyester structure is preferable.

In order to improve interaction between the graft chain and the solvent and thereby to improve dispersibility of the pigment, the graft chain is preferably a graft chain having at least one member selected from the group consisting of a polyester structure, a polyether structure, and a polyacrylate structure, and is more preferably a graft chain having at least one of a polyester structure or a polyether structure.

A macromonomer having such polymer structure as a graft chain is not particularly limited, and, preferably, a macromonomer having a reactive double-bonding group can be suitably used.

As a commercially available macromonomer which is suitably used for synthesizing a polymer compound and corresponds to a structural unit having a graft chain possessed by the polymer compound, the following products are used: AA-6 (trade name, manufactured by Toagosei Co., Ltd.), AA-10 (trade name, manufactured by Toagosei Co., Ltd.), AB-6 (trade name, manufactured by Toagosei Co., Ltd.), AS-6 (trade name, manufactured by Toagosei Co., Ltd.), AN-6 (trade name, manufactured by Toagosei Co., Ltd.), AW-6 (trade name, manufactured by Toagosei Co., Ltd.), AA-714 (trade name, manufactured by Toagosei Co., Ltd.), AY-707 (trade name, manufactured by Toagosei Co., Ltd.), AY-714 (trade name, manufactured by Toagosei Co., Ltd.), AK-5 (trade name, manufactured by Toagosei Co., Ltd.), AK-30 (trade name, manufactured by Toagosei Co., Ltd.), AK-32 (trade name, manufactured by Toagosei Co., Ltd.), BLEMMER PP-100 (trade name, manufactured by NOF CORPORATION), BLEMMER PP-500 (trade name, manufactured by NOF CORPORATION), BLEMMER PP-800 (trade name, manufactured by NOF CORPORATION), BLEMMER PP-1000 (trade name, manufactured by NOF CORPORATION), BLEMMER 55-PET-800 (trade name, manufactured by NOF CORPORATION), BLEMMER PME-4000 (trade name, manufactured by NOF CORPORATION), BLEMMER PSE-400 (trade name, manufactured by NOF CORPORATION), BLEMMER PSE-1300 (trade name, manufactured by NOF CORPORATION), and BLEMMER 43PAPE-600B (trade name, manufactured by NOF CORPORATION. Among these, AA-6 (trade name, manufactured by Toagosei Co., Ltd.), AA-10 (trade name, manufactured by Toagosei Co., Ltd.), AB-6 (trade name, manufactured by Toagosei Co., Ltd.), AS-6 (trade name, manufactured by Toagosei Co., Ltd.), AN-6 (trade name, manufactured by Toagosei Co., Ltd.), BLEMMER PME-4000 (trade name, manufactured by NOF CORPORATION), and the like are preferably used.

The polymer compound preferably contains a structural unit represented by any one of Formulas (1) to (4) as a structural unit having a graft chain, and more preferably contains a structural unit represented by any one of Formula (1A), Formula (2A), Formula (3A), Formula (3B) and Formula (4).

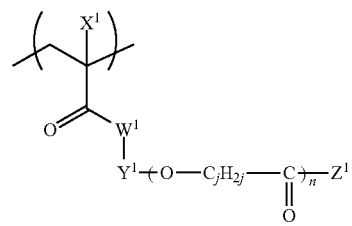

(1)

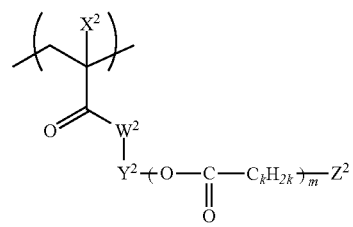

(2)

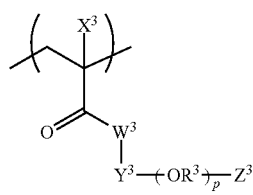

(3)

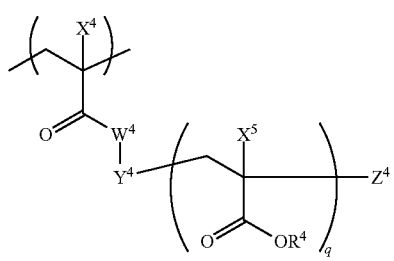

(4)

In Formulas (1) to (4), $W^1$, $W^2$, $W^3$, and $W^4$ each independently represent an oxygen atom or NH. $W^1$, $W^2$, $W^3$, and $W^4$ are preferably oxygen atoms.

In Formulas (1) to (4), $X^1$, $X^2$, $X^3$, $X^4$, and $X^5$ each independently represent a hydrogen atom or a monovalent organic group. From the viewpoint of restrictions on synthesis, it is preferable that $X^1$, $X^2$, $X^3$, $X^4$, and $X^5$ each independently represent a hydrogen atom or an alkyl group having 1 to 12 carbon atoms; it is more preferable that they each independently represent a hydrogen atom or a methyl group; and it is still more preferable that they represent methyl groups.

In Formulas (1) to (4), $Y^1$, $Y^2$, $Y^3$, and $Y^4$ each independently represent a divalent linking group, and the linking group is not particularly restricted in terms of structure. Specific examples of the divalent linking group represented by $Y^1$, $Y^2$, $Y^3$, and $Y^4$ include the following linking groups (Y-1) to (Y-21). In the structures shown below, A and B represent binding sites with a left terminal group and a right terminal group, respectively, in Formulas (1) to (4). Among the structures shown below, (Y-2) or (Y-13) is more preferable from the viewpoint of simplicity of synthesis.

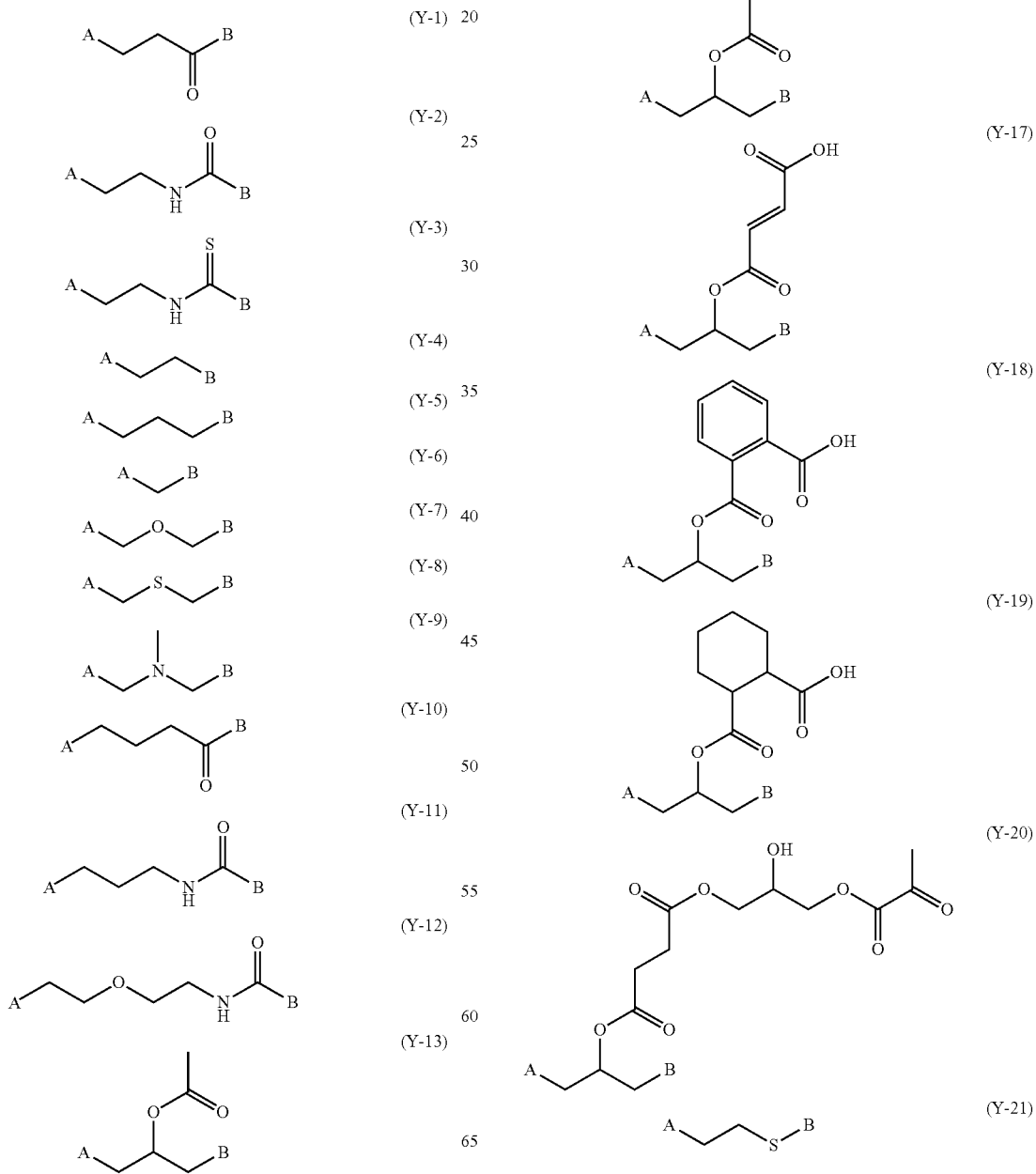

In Formulas (1) to (4), $Z^1$, $Z^2$, $Z^3$, and $Z^4$ each independently represent a monovalent organic group. A structure of the organic group is not particularly limited, and specific examples thereof include an alkyl group, a hydroxyl group, an alkoxy group, an aryloxy group, a heteroaryloxy group, an alkyl thioether group, an aryl thioether group, a heteroaryl thioether group, and an amino group. Among these, from the viewpoint of, in particular, improvement in dispersibility, it is preferable that the organic groups represented by $Z^1$, $Z^2$, $Z^3$, and $Z^4$ each preferably have a steric repulsion effect; and it is preferable that the organic groups are each independently an alkyl group or alkoxy group having 5 to 24 carbon atoms, and, among these, it is particularly preferable that they are each independently a branched alkyl group having 5 to 24 carbon atoms, a cyclic alkyl group having 5 to 24 carbon atoms, or an alkoxy group having 5 to 24 carbon atoms. The alkyl group contained in the alkoxy group may be linear, branched, or cyclic.

In Formulas (1) to (4), n, m, p, and q are each independently an integer of 1 to 500.

Further, in Formulas (1) and (2), j and k each independently represent an integer of 2 to 8. From the viewpoints of dispersion stability and developability, j and k in Formulas (1) and (2) are preferably an integer of 4 to 6, and particularly preferably 5.

In Formula (3), $R^3$ represents a branched or linear alkylene group, preferably an alkylene group having 1 to 10 carbon atoms, and more preferably an alkylene group having 2 or 3 carbon atoms. In a case where p is 2 to 500, a plurality of $R^3$'s may be the same as or different from each other.

In Formula (4), $R^4$ represents a hydrogen atom or a monovalent organic group, and the monovalent organic group is not particularly limited in terms of structure. $R^4$ is preferably a hydrogen atom, an alkyl group, an amyl group, or a heteroaryl group, and more preferably a hydrogen atom or an alkyl group. In a case where $R^4$ is an alkyl group, the alkyl group is preferably a linear alkyl group having 1 to 20 carbon atoms, a branched alkyl group having 3 to 20 carbon atoms, or a cyclic alkyl group having 5 to 20 carbon atoms; more preferably a linear alkyl group having 1 to 20 carbon atoms; and still more preferably a linear alkyl group having 1 to 6 carbon atoms. In Formula (4), in a case where q is 2 to 500, a plurality of $X^5$'s and $R^4$'s present in the graft copolymer may be the same as or different from each other.

Further, the polymer compound can have two or more structural units with different structures having a graft chain. That is, the polymer compound may contain structural units represented by Formulas (1) to (4) having different structures from one another in the molecule thereof. In addition, in a case where n, m, p, and q each represent an integer of 2 or more in Formulas (1) to (4), in Formulas (1) and (2), j's and k's in side chains may contain different structures from each other, and in Formulas (3) and (4), a plurality of $R^3$'s, $R^4$'s, and $X^5$'s in a molecule thereof may be the same as or different from each other.

From the viewpoint of dispersion stability and developability of the composition, the structural unit represented by Formula (1) is more preferably a structural unit represented by Formula (1A).

Further, from the viewpoint of dispersion stability and developability of the composition, the structural unit represented by Formula (2) is more preferably a structural unit represented by Formula (2A).

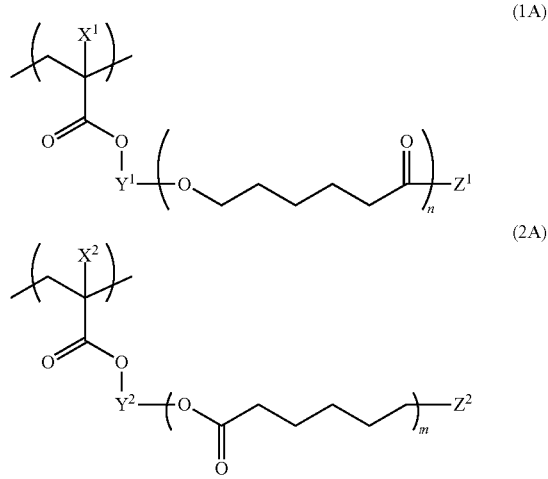

In Formula (1A), $X^1$, $Y^1$, $Z^1$, and n have the same meanings as $X^1$, $Y^1$, $Z^1$, and n in Formula (1), and preferred ranges thereof are also the same. In Formula (2A), $X^2$, $Y^2$, $Z^2$, and m have the same meanings as $X^2$, $Y^2$, $Z^2$, and m in Formula (2), and preferred ranges thereof are also the same.

Further, from the viewpoint of dispersion stability and developability of the composition, the structural unit represented by Formula (3) is more preferably a structural unit represented by Formula (3A) or Formula (3B).

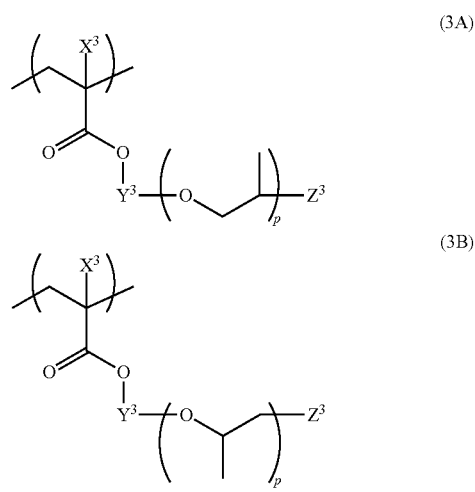

In Formula (3A) or (3B), $X^3$, $Y^3$, $Z^3$, and p have the same meanings as $X^3$, $Y^3$, $Z^3$, and p in Formula (3), and preferred ranges thereof are also the same.

The polymer compound more preferably has a structural unit represented by Formula (1A) as a structural unit having a graft chain.

In the polymer compound, the structural unit having a graft chain (for example, the structural units represented by Formulas (1) to (4)) is preferably contained in an amount of 2 to 90%, and is more preferably contained in a range of 5 to 30%, in terms of mass, with respect to a total mass of the polymer compound. In a case where the structural unit having a graft chain is contained in this range, dispersibility of the pigment (in particular, titanium black particles) is high, and developability at the time of forming a light-shielding film is good.

Further, the polymer compound preferably has a hydrophobic structural unit that is different from the structural unit having a graft chain (that is, it does not correspond to a structural unit having a graft chain). However, in the present invention, the hydrophobic structural unit is a structural unit having no acid group (for example, a carboxylic acid group, a sulfonic acid group, a phosphoric acid group, and a phenolic hydroxyl group).

The hydrophobic structural unit is preferably a structural unit derived from (or corresponding to) a compound (monomer) having a Clog P value of 1.2 or more, and more preferably a structural unit derived from a compound having a Clog P value of 1.2 to 8. Accordingly, an effect of the present invention can be more reliably exerted.

A Clog P value is a value calculated by the program "CLOGP", which is available from Daylight Chemical Information System, Inc. This program provides values of "calculated log P" calculated using Hansch and Leo's fragment approach (see literature below). The fragment approach is based on a chemical structure of a compound, and a log P value of the compound is estimated by dividing the chemical structure into partial structures (fragments) and summing log P contributions allocated to the respective fragments. Details thereof are described in the following literature. In the present invention, Clog P values calculated by the program CLOGP v4.82 are used.

A. J. Leo, Comprehensive Medicinal Chemistry, Vol. 4, C. Hansch, P. G. Sammnens;

J. B. Taylor and C. A. Ramsden, Eds., p. 295, Pergamon Press, 1990 C.; Hansch & A. J. Leo. Substituent Constants for Correlation Analysis in Chemistry and Biology. John Wiley & Sons; and A. J. Leo. Calculating log Poct from structure. Chem. Rev., 93, 1281-1306, 1993.

A log P means a common logarithm of a partition coefficient P, and is a physical property which represents, as a quantitative numerical value, how an organic compound is distributed in an equilibrium of a two-phase system of oil (typically 1-octanol) and water. The log P is expressed in the following expression.

$$\log P = \log(C_{oil}/C_{water})$$

In the expression, Coil represents a molar concentration of the compound in an oil phase, and Cwater represents a molar concentration of the compound in a water phase.

The above expression means that in a case where the value of log P increases in a positive direction across 0, oil solubility increases, and in a case where an absolute value increases in a negative direction, water solubility increases. The log P has a negative correlation with water solubility of an organic compound and is widely used as a parameter for estimating hydrophilic or hydrophobic properties of the organic compound.

The polymer compound preferably has one or more structural units selected from structural units derived from monomers represented by General Formulas (i) to (iii) as a hydrophobic structural unit.

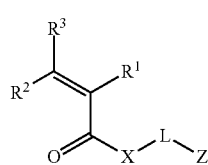

(i)

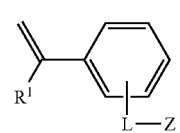

(ii)

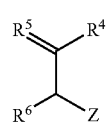

(iii)

In General Formulas (i) to (iii), $R^1$, $R^2$, and $R^3$ each independently represent a hydrogen atom, a halogen atom (for example, fluorine, chlorine, and bromine) or an alkyl group having 1 to 6 carbon atoms (for example, a methyl group, an ethyl group, and a propyl group).

$R^1$, $R^2$, and $R^3$ are more preferably a hydrogen atom or an alkyl group having 1 to 3 carbon atoms, and more preferably a hydrogen atom or a methyl group. $R^2$ and $R^3$ are particularly preferably hydrogen atoms.

X represents an oxygen atom (—O—) or an imino group (—NH—), and is preferably an oxygen atom.

L is a single bond or a divalent linking group. Examples of the divalent linking group include a divalent aliphatic group (for example, an alkylene group, a substituted alkylene group, an alkenylene group, a substituted alkenylene group, an alkynylene group, and a substituted alkynylene group), a divalent aromatic group (for example, an arylene group, and a substituted arylene group), a divalent heterocyclic group, an oxygen atom (—O—), a sulfur atom (—S—), an imino group (—NH—), a substituted imino group (—NR$^{31}$—, where R$^{31}$ is an aliphatic group, an aromatic group, or a heterocyclic group), a carbonyl group (—CO—), and combinations thereof.

The divalent aliphatic group may have a cyclic structure or a branched structure. The number of carbon atoms of the aliphatic group is preferably 1 to 20, more preferably 1 to 15, and still more preferably 1 to 10. The aliphatic group may be an unsaturated aliphatic group or a saturated aliphatic group, and a saturated aliphatic group is preferable. In addition, the aliphatic group may have a substituent. Examples of the substituent include a halogen atom, an aromatic group, and a heterocyclic group.

The number of carbon atoms of the divalent aromatic group is preferably 6 to 20, more preferably 6 to 15, and still more preferably 6 to 10. In addition, the aromatic group may have a substituent. Examples of the substituent include a halogen atom, an aliphatic group, an aromatic group, and a heterocyclic group.

The divalent heterocyclic group preferably has a 5-membered ring or a 6-membered ring as a heterocyclic ring. Another heterocyclic ring, aliphatic ring, or aromatic ring may be condensed with the heterocyclic ring. In addition, the heterocyclic group may have a substituent. Examples of the substituent include a halogen atom, a hydroxy group, an oxo group (=O), a thioxo group (=S), an imino group (=NH), a substituted imino group (=N—R$^{32}$, where R$^{32}$ is an aliphatic group, an aromatic group, or a heterocyclic group), an aliphatic group, an aromatic group, and a heterocyclic group.

L is preferably a single bond, an alkylene group, or a divalent linking group containing an oxyalkylene structure. The oxyalkylene structure is more preferably an oxyethylene structure or an oxypropylene structure. In addition, L may contain a polyoxyalkylene structure containing two or more oxyalkylene structures in a repeated manner. As the polyoxyalkylene structure, a polyoxyethylene structure or a polyoxypropylene structure is preferable. The polyoxyethylene structure is represented by —(OCH$_2$CH$_2$)n-, where n is preferably an integer of 2 or more, and more preferably an integer of 2 to 10.

Examples of Z include an aliphatic group (for example, an alkyl group, a substituted alkyl group, an unsaturated alkyl group, and a substituted unsaturated alkyl group), an aromatic group (for example, an arylene group, and a substituted arylene group), a heterocyclic group, an oxygen atom (—O—), a sulfur atom (—S—), an imino group (—NH—), a substituted imino group (—NR$^{31}$—, where R$^{31}$ is an aliphatic group, an aromatic group, or a heterocyclic group), a carbonyl group (—CO—), and combinations thereof.

The aliphatic group may have a cyclic structure or a branched structure. The number of carbon atoms of the aliphatic group is preferably 1 to 20, more preferably 1 to 15, and still more preferably 1 to 10. The aliphatic group further includes a ring-assembled hydrocarbon group and a bridged cyclic hydrocarbon group, and examples of the ring-assembled hydrocarbon group include a bicyclohexyl group, a perhydronaphthalenyl group, a biphenyl group, a 4-cyclohexylphenyl group, and the like. Examples of the bridged cyclic hydrocarbon ring include a bicyclic hydrocarbon ring such as pinane, bomane, norpinane, norbornane, and bicyclooctane ring (bicyclo[2.2.2]octane ring, bicyclo[3.2.1]octane ring, or the like); a tricyclic hydrocarbon ring such as homobredane, adamantane, tricyclo[5.2.1.0$^{2,6}$]decane, and tricyclo[4.3.1.1$^{2,5}$]undecane ring; and a tetracyclic hydrocarbon ring such as tetracylo[4.4.0.1$^{2,5}$,1$^{7,10}$]dodecane and perhydro-1,4-methano-5,8-methanonaphthalene ring. In addition, the bridged cyclic hydrocarbon ring includes condensed cyclic hydrocarbon rings, for example, a condensed ring formed by condensing a plurality of 5-membered to 8-membered cycloalkane rings such as perhydronaphthalene (decalin), perhydroanthracene, perhydrophenanthrene, perhydroacenaphthene, perhydrofluorene, perhydroindene, and perhydrophenanthrene ring.

The aliphatic group is preferably a saturated aliphatic group rather than an unsaturated aliphatic group. In addition, the aliphatic group may have a substituent. Examples of the substituent include a halogen atom, an aromatic group, and a heterocyclic group. However, the aliphatic group does not have an acid group as the substituent.

The number of carbon atoms of the aromatic group is preferably 6 to 20, more preferably 6 to 15, and still more preferably 6 to 10. In addition, the aromatic group may have a substituent. Examples of the substituent include a halogen atom, an aliphatic group, an aromatic group, and a heterocyclic group. However, the aromatic group does not have an acid group as the substituent.

The heterocyclic group preferably has a 5-membered ring or a 6-membered ring as a heterocyclic ring. Another heterocyclic ring, aliphatic ring or aromatic ring may be condensed with the heterocyclic ring. In addition, the heterocyclic group may have a substituent. Examples of the substituent include a halogen atom, a hydroxy group, an oxo group (=O), a thioxo group (=S), an imino group (=NH), a substituted imino group (=N—R$^{32}$, where R$^{32}$ is an aliphatic group, an aromatic group, or a heterocyclic group), an aliphatic group, an aromatic group, and a heterocyclic group. However, the heterocyclic group does not have an acid group as the substituent.

In General Formula (iii), R$^4$, R$^5$, and R$^6$ each independently represent a hydrogen atom, a halogen atom (for example, fluorine, chlorine, and bromine), an alkyl group having 1 to 6 carbon atoms (for example, a methyl group, an ethyl group, and a propyl group), Z, or -L-Z. Here, L and Z have the same meaning as those in the above. R$^4$, R$^5$, and R$^6$ are preferably a hydrogen atom or an alkyl group having 1 to 3 carbon atoms, and more preferably a hydrogen atom.

In the present invention, as a monomer represented by General Formula (i), preferred compounds are those in which R$^1$, R$^2$ and R$^3$ are hydrogen atoms or methyl groups, and L is a single bond, an alkylene group, or a divalent linking group containing an oxyalkylene structure, X is an oxygen atom or an imino group, and Z is an aliphatic group, a heterocyclic group, or an aromatic group.

Further, as a monomer represented by General Formula (ii), preferred compounds are those in which R$^1$ is a hydrogen atom or a methyl group, L is an alkylene group, and Z is an aliphatic group, a heterocyclic group, or an aromatic group. In addition, as a monomer represented by General Formula (iii), preferred compounds are those in which R$^4$, R$^5$, and R$^6$ are a hydrogen atom or a methyl group, and Z is an aliphatic group, a heterocyclic group, or an aromatic group.

Examples of the monomers represented by General Formulas (i) to (iii) include radically polymerizable compounds selected from acrylic acid esters, methacrylic acid esters, styrenes, and the like.

As examples of the monomers represented by General Formulas (i) to (iii), reference can be made to compounds described in paragraph numbers 0089 to 0093 of JP2013-249417A, the contents of which are incorporated herein.

In the polymer compound, the hydrophobic structural unit is preferably contained in a range of 10 to 90%, and more preferably in a range of 20 to 80%, in terms of mass, with respect to a total mass of the polymer compound. In a case where the content of the hydrophobic structural unit is in the above-mentioned range, a sufficient pattern formation is obtained.

The polymer compound can introduce a functional group capable of interacting with a pigment (in particular, titanium black). Here, it is preferable that the polymer compound has a structural unit having a functional group capable of interacting with a pigment.

Examples of the functional groups capable of interacting with a pigment include an acid group, a basic group, a coordinating group, and a reactive functional group.

In a case where the polymer compound has an acid group, a basic group, a coordinating group, or a reactive functional group, it is preferable to have a structural unit having an acid group, a structural unit having a basic group, a structural unit having a coordinating group, or a structural unit having reactivity, respectively.

In particular, by further containing an alkali-soluble group, such as a carboxylic acid group, as an acid group, developability for pattern formation by alkali development can be imparted to the polymer compound.

That is, by introducing the alkali-soluble group into the polymer compound, the polymer compound has alkali solubility as a dispersant which contributes to dispersion of the pigment. A composition containing such polymer compound exhibits excellent light-shielding properties at exposed portions, and improves alkali developability at unexposed portions.

Further, by having a structural unit having an acid group, the polymer compound has an affinity for a solvent, so that coating properties thereof also tend to be improved.

It is presumed that in the structural unit having the acid group, the acid group easily interacts with a pigment, and the polymer compound stably disperses the pigment while a viscosity of the polymer compound that disperses the pigment is lowered, so that the polymer compound itself is easily stably dispersed.

However, the structural unit having an alkali-soluble group as an acid group may be same as or different from the above-mentioned structural unit having a graft chain. Meanwhile, the structural unit having an alkali-soluble group as an acid group is a structural unit different from the above-mentioned hydrophobic structural unit (that is, it does not correspond to the above-mentioned hydrophobic structural unit).

Examples of the acid group which is a functional group capable of interacting with a pigment include a carboxylic acid group, a sulfonic acid group, a phosphoric acid group, and a phenolic hydroxyl group: at least one of a carboxylic acid group, a sulfonic acid group, or a phosphoric acid group is preferable; and a carboxylic acid group is more preferable from the viewpoint of good adsorptivity to the pigment and high dispersibility of the pigment.

That is, it is preferable that the polymer compound further has a structural unit having at least one of a carboxylic acid group, a sulfonic acid group, or a phosphoric acid group.

The polymer compound may have one or more structural units having an acid group.

The polymer compound may or may not contain a structural unit having an acid group. In a case of containing the structural unit having an acid group, a content of the structural unit having an acid group is preferably 5% to 80%, in terms of mass, with respect to a total mass of the polymer compound, and more preferably 10% to 60% from the viewpoint of inhibiting damage to image intensity caused by alkali development.

Examples of the basic group which is a functional group capable of interacting with a pigment include a primary amino group, a secondary amino group, a tertiary amino group, a hetero ring containing an N atom, and an amide group; and a tertiary amino group is preferable from the viewpoint of good adsorptivity to the pigment and high dispersibility of the pigment. The polymer compound may have one or more of these basic groups.

The polymer compound may or may not contain a structural unit having a basic group. In a case of containing the structural unit having a basic group, a content of the structural unit having a basic group is preferably 0.01% to 50%, in terms of mass, with respect to a total mass of the polymer compound, and more preferably 0.01% to 30% from the viewpoint of suppressing inhibition of developability.

Examples of the coordinating group which is a functional group capable of interacting with a pigment and the functional group having reactivity include an acetylacetoxy group, a trialkoxysilyl group, an isocyanate group, an acid anhydride, and an acid chloride. An acetylacetoxy group is preferable from the viewpoint of good adsorptivity to the pigment and high dispersibility of the pigment. The polymer compound may have one or more of these groups.

The polymer compound may or may not contain a structural unit having a coordinating group or a structural unit having a functional group having reactivity. In a case of containing these structural units, a content of such structural units is preferably 10% to 80%, in terms of mass, with respect to a total mass of the polymer compound, and more preferably 20% to 60% from the viewpoint of suppressing inhibition of developability.

In a case where the polymer compound in the present invention has, in addition to the graft chain, a functional group capable of interacting with a pigment, the polymer compound may have the above-described functional groups capable of interacting with various pigments. How these functional groups are introduced is not particularly limited, and the polymer compound preferably has at least one structural unit selected from structural units derived from monomers represented by General Formulas (iv) to (vi).

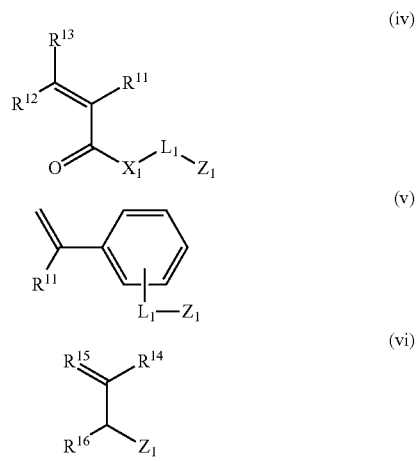

In General Formulas (iv) to (vi), $R^{11}$, $R^{12}$, and $R^{13}$ each independently represent a hydrogen atom, a halogen atom (for example, a fluorine atom, a chlorine atom, and a bromine atom), or an alkyl group having 1 to 6 carbon atoms (for example, a methyl group, an ethyl group, and a propyl group).

In General Formulas (iv) to (vi), it is more preferable that $R^{11}$, $R^{12}$, and $R^{13}$ are each independently a hydrogen atom or an alkyl group having 1 to 3 carbon atoms, and it is most preferable that they are each independently a hydrogen atom or a methyl group. In General Formula (iv), it is particularly preferable that $R^{12}$ and $R^{13}$ are each a hydrogen atom.

$X_1$ in General Formula (iv) represents an oxygen atom (—O—) or an imino group (—NH—), and the oxygen atom is preferable.

Further, Y in General Formula (v) represents a methine group or a nitrogen atom.

Further, $L_1$ in General Formulas (iv) to (v) represents a single bond or a divalent linking group. Examples of the divalent linking group include a divalent aliphatic group (for example, an alkylene group, a substituted alkylene group, an alkenylene group, a substituted alkenylene group, an alkynylene group, and a substituted alkynylene group), a divalent aromatic group (for example, an arylene group and a substituted arylene group), a divalent heterocyclic group, an oxygen atom (—O—), a sulfur atom (—S—), an imino group (—NH—), a substituted imino bond (—NR$^{31'}$, where R$^{31'}$ is an aliphatic group, an aromatic group, or a heterocyclic group), a carbonyl bond (—CO—), and combinations thereof.

The divalent aliphatic group may have a cyclic structure or a branched structure. The number of carbon atoms of the aliphatic group is preferably 1 to 20, more preferably 1 to 15, and still more preferably 1 to 10. The aliphatic group is preferably a saturated aliphatic group rather than the unsaturated aliphatic group. In addition, the aliphatic group may have a substituent. Examples of the substituent include a halogen atom, a hydroxyl group, an aromatic group, and a heterocyclic group.

The number of carbon atoms of the divalent aromatic group is preferably 6 to 20, more preferably 6 to 15, and still more preferably 6 to 10. In addition, the aromatic group may have a substituent. Examples of the substituent include a halogen atom, a hydroxyl group, an aliphatic group, an aromatic group, and a heterocyclic group.

The divalent heterocyclic group preferably has a 5-membered ring or a 6-membered ring as a heterocyclic ring. One or more of another heterocyclic ring, aliphatic ring or aromatic ring may be condensed with the heterocyclic ring. In addition, the heterocyclic group may have a substituent. Examples of the substituent include a halogen atom, a hydroxy group, an oxo group (=O), a thioxo group (=S), an imino group (=NH), a substituted imino group (=N—$R^{32}$, where $R^{32}$ is an aliphatic group, an aromatic group, or a heterocyclic group), an aliphatic group, an aromatic group, and a heterocyclic group.

$L_1$ is preferably a single bond, an alkylene group, or a divalent linking group containing an oxyalkylene structure. The oxyalkylene structure is more preferably an oxyethylene structure or an oxypropylene structure. In addition, L may contain a polyoxyalkylene structure containing two or more oxyalkylene structures in a repeated manner. As the polyoxyalkylene structure, a polyoxyethylene structure or a polyoxypropylene structure is preferable. The polyoxyethylene structure is represented by —(OCH$_2$CH$_2$)n-, where n is preferably an integer of 2 or more, and more preferably an integer of 2 to 10.

In General Formulas (iv) to (vi), $Z_1$ represents, in addition to the graft chain, a functional group capable of interacting with a pigment; a carboxylic acid group or a tertiary amino group is preferable; and a carboxylic acid group is more preferable.

In General Formula (vi), $R^{14}$, $R^{15}$, and $R^{16}$ each independently represent a hydrogen atom, a halogen atom (for example, fluorine, chlorine, and bromine), an alkyl group having 1 to 6 carbon atoms (for example, a methyl group, an ethyl group and a propyl group), —$Z_1$, or -$L_1$-$Z_1$. Here, $L_1$ and $Z_1$ have the same meanings as $L_1$ and $Z_1$ in the above, and preferred examples thereof are also the same. $R^{14}$, $R^{15}$, and $R^{16}$ are each independently a hydrogen atom or an alkyl group having 1 to 3 carbon atoms, and more preferably a hydrogen atom.

In the present invention, as a monomer represented by General Formula (iv), preferred compounds are those in which $R^{11}$, $R^{12}$, and $R^{13}$ are each independently preferably a hydrogen atom or a methyl group, $L_1$ is an alkylene group or a divalent linking group containing an oxyalkylene structure, X is an oxygen atom or an imino group, and Z is a carboxylic acid group.

Further, as a monomer represented by General Formula (v), preferred compounds are those in which $R^{11}$ is a hydrogen atom or a methyl group, $L_1$ is an alkylene group, $Z_1$ is a carboxylic acid group, and Y is a methine group.

Furthermore, as a monomer represented by General Formula (vi), preferred compounds are those in which $R^{14}$, $R^{15}$, and $R^{16}$ are each independently a hydrogen atom or a methyl group, L is a single bond or an alkylene group, and Z is a carboxylic acid group.

Representative examples of monomers (compounds) represented by General Formulas (iv) to (vi) are shown below.

Examples of the monomers include methacrylic acid, crotonic acid, isocrotonic acid, a reaction product of a compound having an addition polymerizable double bond and a hydroxyl group in a molecule thereof (for example, 2-hydroxyethyl methacrylate) and succinic anhydride, a reaction product of a compound having an addition polymerizable double bond and a hydroxyl group in a molecule thereof and a phthalic anhydride, a reaction product of a compound having an addition polymerizable double bond and a hydroxyl group in a molecule thereof and tetrahydroxyphthalic anhydride, a reaction product of a compound having an addition polymerizable double bond and a hydroxyl group in a molecule thereof and trimellitic anhydride, a reaction product of a compound having an addition polymerizable double bond and a hydroxyl group in a molecule thereof and pyromellitic anhydride, acrylic acid, acrylic acid dimer, acrylic acid oligomer, maleic acid, itaconic acid, fumaric acid, 4-vinylbenzoic acid, vinylphenol, and 4-hydroxyphenyl methacrylamide.

From the viewpoint of interaction with a pigment, dispersion stability, and permeability to a developer, a content of the structural unit having a functional group capable of interacting with a pigment is preferably 0.05% by mass to 90% by mass, more preferably 1.0% by mass to 80% by mass, and still more preferably 10% by mass to 70% by mass, with respect to the entire mass of the polymer compound.

Furthermore, for the purpose of improving various performances such as image strength, as long as an effect of the present invention is not impaired, the polymer compound may further have other structural units (for example, a structural unit having a functional group with an affinity for a dispersion medium used for a dispersion) having various functions which differ from the structural unit having a graft chain, the hydrophobic structural unit, and the structural unit having a functional group capable of interacting with a pigment.

Examples of such other structural units include structural units derived from radically polymerizable compounds selected from, for example, acrylonitriles and methacrylonitriles.

One or two or more of these other structural units can be used in the polymer compound, and a content thereof is preferably 0% or more and 80% or less, and more preferably 10% or more and 60% or less, in terms of mass, with respect to a total mass of the polymer compound. In a case where the content of other structural units is in the above-mentioned range, a sufficient pattern formability is maintained.

An acid value of the polymer compound is preferably in a range of 0 mg KOH/g to 160 mg KOH/g, more preferably in a range of 10 mg KOH/g to 140 mg KOH/g, and still more preferably in a range of 20 mg KOH/g to 120 mg KOH/g.

In a case where the acid value of the polymer compound is 160 mg KOH/g or less, pattern peeling during development at the time of forming a light-shielding film can be suppressed more effectively. In addition, in a case where the acid value of the polymer compound is 10 mg KOH/g or more, alkali developability becomes better. In addition, in a case where the acid value of the polymer compound is 20 mg KOH/g or more, sedimentation of a pigment (in particular, titanium black) or a dispersed body containing titanium black and Si atoms can be further suppressed and the number of coarse particles can be further reduced, so that temporal stability of a composition can be further improved.

In the present invention, the acid value of the polymer compound can be calculated from, for example, an average content of acid groups in the polymer compound. In addition, by changing a content of the structural unit containing an acid group which is a constituent component of the polymer compound, a resin having a desired acid value can be obtained.

In a case of forming a light-shielding film, a weight average molecular weight of the polymer compound in the present invention is, in terms of a polystyrene-equivalent value measured by a gel permeation chromatography (GPC)

method, preferably 4,000 or more and 300,000 or less, more preferably 5,000 or more and 200,000 or less, still more preferably 6,000 or more and 100,000 or less, and particularly preferably 10,000 or more and 50,000 or less, from the viewpoint of suppression of pattern peeling and developability during development.

The GPC method uses HLC-8020GPC (manufactured by Tosoh Corporation) and is based on a method using TSKgel SuperHZM-H, TSKgel SuperHZ4000, or TSKgel SuperHZ2000 (manufactured by Tosoh Corporation, 4.6 mm ID×15 cm) as a column and THF (tetrahydrofuran) as an eluent.

The polymer compound can be synthesized by a known method. Although not particularly limited, synthesis of the polymer compound is preferably carried out in the presence of an organo tin compound catalyst. As the organo tin compound catalyst, catalysts known in the related art can be used.

There are no particular limitations on the organo tin compound as long as it has a transesterification capability, and examples thereof include dioctyl tin compounds such as dioctyltin bis(isooctylthioglycolate), dioctyltin bismaleate, dioctyltin bismaleate polymer, and dioctyltin dilaurate; dibutyltin compounds such as dibutyltin bismaleate, dibutyltin bismaleate polymer, dibutyltin dilaurate, dibutyltin diacetate, dibutyltin β-mercaptopropionate polymer, dibutyltin acetylacetonate, and dibutyltin oxide; and dimethyltin compounds such as dimethyltin bis(isooctylmercaptoacetate). In addition, other than those, monooctyltin tris (isooctylthioglycolate), monobutyltin oxide, monobutyltin hydroxychloride, monobutyltin trioctoate, tin oxalate, tin octylate, and the like are mentioned.

Either one of the organo tin compound catalysts may be used, but any mixture of two or more thereof may be used.

From the viewpoints of high catalytic activity and high boiling point, and difficulty of being incorporated in an object to be manufactured during distillation, a dibutyltin compound is preferable, and at least one of dibutyltin dilaurate or dibutyltin oxide is more preferable.

The organo tin compound catalyst can also be used in the synthesis of a cyclic or chain-like polyester compound as described later.

The polymer compound can be synthesized by a known method. Examples of a solvent to be used for synthesizing the polymer compound include ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethylformamide, N,N-dimethylacetamide, dimethylsulfoxide, toluene, ethyl acetate, methyl lactate, and ethyl lactate. These solvents may be used alone or in combination of two or more thereof.

Specific examples of the polymer compound that can be used in the present invention include "Disperbyk-161, 162, 163, 164, 165, 166, 170, 190 (all trade names, high-molecular-weight copolymer)" manufactured by BYK Chemie, "EFKA 4047, 4050, 4010, 4165 (all trade names, polyurethane type), EFKA 4330, 4340 (all trade names, block copolymer)" manufactured by EFKA.

These polymer compounds may be used alone or in combination of two or more thereof.

As specific examples of the polymer compound, reference can be made to polymer compounds described in paragraph numbers 0127 to 0129 of JP2013-249417A, the contents of which are incorporated herein.

Further, as the dispersant, in addition to the above-mentioned polymer compound, a graft copolymer in paragraph numbers 0037 to 0115 of in JP2010-106268A (paragraph numbers 0075 to 0133 at columns in corresponding US2011/0124824) can be used, the contents thereof can be cited hereby and are incorporated herein.

Further, in addition to the above, polymer compounds, that contain a constituent component having a side chain structure in which an acidic group is bonded via a linking group, in paragraph numbers 0028 to 0084 of JP2011-153283A (paragraph numbers 0075 to 0133 at columns in corresponding US2011/0279759), can be used, and the contents thereof can be cited hereby and are incorporated herein.

A content of the dispersant in the dispersion composition of the present invention is preferably 0.1% to 50% by mass, and more preferably 0.5% to 30% by mass, with respect to the entire solid content of the composition.

<Cyclic or Chain-Like Polyester Compound>

The dispersion composition of the present invention contains a cyclic or chain-like polyester compound.

Here, the "polyester compound" means a compound containing a plurality of ester groups.

A molecular weight of the cyclic or chain-like polyester compound is not particularly limited as long as it is lower than a molecular weight of the dispersant, and it is preferably equal to or greater than 500 and less than 4000, more preferably 500 to 3,500, still more preferably 500 to 3,000, even more preferably 600 to 3,000, particularly preferably 1,000 to 3,000, and most preferably 1,000 to 2,500. In a case of being set to the above-mentioned numerical range, it is possible to further improve storage stability of the dispersion composition. The cyclic or chain-like polyester compound may have a distribution. In a case of having a molecular weight distribution, the molecular weight of the compound means a weight average molecular weight.

The weight average molecular weight is measured in terms of a polystyrene-equivalent value by a gel permeation chromatography (GPC) method.

The GPC method uses HLC-8020GPC (manufactured by Tosoh Corporation) and is based on a method using TSKgel SuperHZM-H, TSKgel SuperHZ4000, or TSKgel SuperHZ2000 (manufactured by Tosoh Corporation, 4.6 mm ID×15 cm) as a column and THF (tetrahydrofuran) as an eluent.

A structure of the chain-like polyester compound is not particularly limited, and examples thereof include a polycondensate of a polyvalent carboxylic acid and a polyhydric alcohol, and a ring-opened polymer of a lactone (as the lactone, those having 1 to 10 carbon atoms are preferable and those having 4 to 8 carbon atoms are more preferable, and examples thereof include caprolactone and valerolactone.) and an alcohol. In addition, the chain-like polyester compound may be a chain-like polyester compound having a plurality of carbon atoms in a molecule thereof.

A structure of the cyclic polyester compound is not particularly limited, and examples thereof include those having a cyclic structure obtained by ring closure reaction of a ring-opened polymer of a lactone (as the lactone, those having 1 to 10 carbon atoms are preferable and those having 4 to 8 carbon atoms are more preferable, and examples thereof include caprolactone and valerolactone.) and an alcohol. In addition, the cyclic polyester compound may be a cyclic polyester compound having a plurality of carbon atoms in a molecule thereof.

A group at the terminal of the chain-like polyester compound is not particularly limited. However, in order to exhibit an effect of the present invention, the terminal of the chain-like polyester compound preferably does not have a group having high adsorbability to a pigment such as a carboxylic acid group, a sulfonic acid group, a phosphoric acid group, or a phenolic hydroxyl group. As the terminal thereof, other groups are preferable, and a hydroxyl group or an amino group is more preferable.

The cyclic or chain-like polyester compound is preferably a polymer or oligomer containing a plurality of structural units having an ester structure, and a total of molecular weights of the structural units having a plurality of ester structures as described above is preferably 80% by mass or more with respect to the entire molecular weight. By adjusting the amount of the structural unit having an ester structure in the cyclic or chain-like polyester compound to the above-mentioned range, it is possible to further improve storage stability. The total of the molecular weights of the structural units having an ester structure in the cyclic or chain-like polyester compound is preferably 85% by mass or more, more preferably 90% by mass or more, and particularly preferably 95% by mass or more, with respect to the entire molecular weight.

For example, in the compound represented by General Formula (1) as described later, a total of molecular weights of the structural units having an ester structure is 100% by mass with respect to the entire molecular weight. In addition, in the compound represented by General Formula (2), a total of molecular weights of the structural units having an ester structure is a value obtained by subtracting a molecular weight of $R^1$ and a molecular weight of $R^2$ from the entire molecular weight. Therefore, in a case where, in the compound represented by General Formula (2), for example, $R^1$=amino group, $R^2$=2-ethylhexyl group, b=5, and m=5, a total of molecular weights of the structural units having an ester structure is 83.9% by mass with respect to the entire molecular weight.

A content of the cyclic or chain-like polyester compound may be about 0.001% to 15% by mass with respect to the entire mass of the dispersion composition, in which, from the viewpoint of more excellent storage stability (in particular, suppression of spectral change), 0.001% to 5.0% by mass is preferable; 0.001% to 3.0% by mass is more preferable; 0.001% to 1.5% by mass is still more preferable; 0.01% to 1.5% by mass is even more preferable; and 0.2% to 1.5% by mass is particularly preferable.

From the viewpoint of further improving storage stability of the dispersion composition (in particular, suppressing generation of foreign matters), the content of the cyclic or chain-like polyester compound in the dispersion composition is preferably 0.005% to 20% by mass, more preferably 0.005% to 10% by mass, still more preferably 0.005% to 5% by mass, and even more preferably 0.1 to 3% by mass, with respect to a dispersant (the entire mass of the dispersant).

The cyclic or chain-like polyester compound is preferably a compound represented by General Formula (1) or General Formula (2).

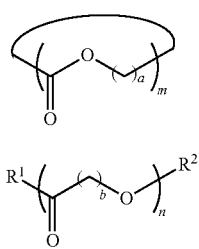

In General Formula (1), a represents an integer of 1 to 8, and m represents an integer of 3 to 100.

In General Formula (2), b represents an integer of 1 to 8, n represents an integer of 3 to 100, $R^1$ represents a hydroxyl group or an amino group, and $R^2$ represents a monovalent organic group or a hydrogen atom.

In General Formulas (1) and (2), a and b each independently represent an integer of 1 to 8, preferably 2 to 8, and more preferably 4 to 8.

Further, n and m each independently represent an integer of 3 to 100, preferably 3 to 50, and more preferably 3 to 30.

Further, $R^1$ represents a hydroxyl group or an amino group. Examples of the amino group represented by $R^1$ include, but are not limited to, a primary amino group (—$NH_2$), a secondary amino group (—N—(R')H, where R' is an alkyl group having 3 or less carbon atoms), and a tertiary amino group (—N(R")$_2$, where R" is an alkyl group having 3 or less carbon atoms), and —$NH_2$ group is particularly preferable.

Further, $R^2$ represents a hydrogen atom or a monovalent organic group. Examples of the monovalent organic group include, but are not limited to, an aliphatic group (for example, an alkyl group, a substituted alkyl group, an unsaturated alkyl group, and a substituted unsaturated alkyl group), an aromatic group (for example, an arylene group and a substituted arylene group), a heterocyclic group, an oxygen atom (—O—), a sulfur atom (—S—), an imino group (—NH—), a substituted imino group (—$NR^{31}$—, where $R^{31}$ is an aliphatic group, an aromatic group, or a heterocyclic group), a carbonyl group (—CO—), and combinations thereof.

The aliphatic group may have a cyclic structure or a branched structure. The number of carbon atoms of the aliphatic group is preferably 1 to 20, more preferably 1 to 15, and still more preferably 1 to 10. The aliphatic group further includes a ring-assembled hydrocarbon group and a bridged cyclic hydrocarbon group, and examples of the ring-assembled hydrocarbon group include a bicyclohexyl group, a perhydronaphthalenyl group, a biphenyl group, a 4-cyclohexylphenyl group, and the like. Examples of the bridged cyclic hydrocarbon ring include a bicyclic hydrocarbon ring such as pinane, bornane, norpinane, norbornane, and bicyclooctane ring (bicyclo[2.2.2]octane ring, bicyclo[3.2.1]octane ring, or the like); a tricyclic hydrocarbon ring such as homobredane, adamantane, tricyclo[5.2.1.0$^{2,6}$]decane, and tricyclo[4.3.1.1$^{2,5}$]undecane ring; and a tetracyclic hydrocarbon ring such as tetracyclo[4.4.0.1$^{2,5}$.1$^{7,10}$]dodecane and perhydro-1,4-methano-5,8-methanonaphthalene ring. In addition, the bridged cyclic hydrocarbon ring includes condensed cyclic hydrocarbon rings, for example, a condensed ring formed by condensing a plurality of 5-membered to 8-membered cycloalkane rings such as perhydronaphthalene (decalin), perhydroanthracene, perhydrophenanthrene, perhydroacenaphthene, perhydrofluorene, perhydroindene, or perhydrophenanthrene ring.

The aliphatic group is preferably a saturated aliphatic group rather than an unsaturated aliphatic group. In addition, the aliphatic group may have a substituent. Examples of the substituent include a halogen atom, an aromatic group, and a heterocyclic group. However, the aliphatic group does not have an acid group as the substituent.

The number of carbon atoms of the aromatic group is preferably 6 to 20, more preferably 6 to 15, and still more preferably 6 to 10. In addition, the aromatic group may have a substituent. Examples of the substituent include a halogen atom, an aliphatic group, an aromatic group, and a heterocyclic group. However, the aromatic group does not have an acid group as the substituent.

The heterocyclic group preferably has a 5-membered ring or a 6-membered ring as a heterocyclic ring. Another heterocyclic ring, aliphatic ring or aromatic ring may be condensed with the heterocyclic ring. In addition, the heterocyclic group may have a substituent. Examples of the substituent include a halogen atom, a hydroxy group, an oxo group (=O), a thioxo group (=S), an imino group (=NH), a substituted imino group (=N—$R^{32}$, where $R^{32}$ is an aliphatic group, an aromatic group, or a heterocyclic group), an aliphatic group, an aromatic group, and a heterocyclic group. However, the heterocyclic group does not have an acid group as the substituent.

<Solvent>

The dispersion composition of the present invention preferably contains a solvent. As the solvent, water or an organic solvent is mentioned.

As examples of the organic solvent, for example, acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether propylene glycol monoethyl ether, acetylacetone, cyclohexanone, cyclopentanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, ethyl acetate, butyl acetate, methyl lactate, ethyl lactate, cyclohexyl acetate, and the like are mentioned, but not limited thereto.

Among these, a solvent having a cyclic structure is preferable from the viewpoint of further improving storage stability (further suppressing generation of foreign matters in a light-shielding film). Examples of the solvent having a cyclic structure include cyclic ketone compounds such as cyclobutanone, cyclopentanone, cyclohexane, 1,4-cyclohexanedione, and isophorone; lactone compounds such as γ-butyrolactone and propylene carbonate; saturated alicyclic compounds such as cyclohexyl acetate; and cyclic ether compounds such as propylene oxide and 1,3,5-trioxane, in which cyclopentanone, cyclohexanone, and cyclohexyl acetate are more preferable, and cyclopentanone is still more preferable.

The solvents may be used alone or in combination of two or more thereof.

In a case where two or more of the solvents are used in combination, it is preferable that the solvents are composed of two or more selected, from the group consisting of 3-ethoxypropionic acid methyl, ethyl 3-ethoxypropionate, ethylcellosolve acetate, ethyl lactate, diethylene glycol dimethyl ether, butyl acetate, cyclohexyl acetate, methyl 3-methoxypropionate, 2-heptanone, cyclohexanone, cyclopentanone, ethyl carbitol acetate, butyl carbitol acetate, propylene glycol methyl ether, and propylene glycol methyl ether acetate; and it is more preferable that the solvents are composed of a combination of a solvent having a non-cyclic structure and a solvent having a cyclic structure.

In a case where the dispersion composition contains a solvent, the amount of the solvent is preferably 10% to 90% by mass, and more preferably 20% to 85% by mass, with respect to the entire mass of the composition.

As a process of dispersing a pigment, a process using compression, squeezing, impact, shearing, cavitation, or the like as a mechanical force used for dispersing is mentioned. Specific examples of these processes include a beads mill, a sand mill, a roll mill, a ball mill, a high speed impeller, a sand grinder, a flow jet mixer, high pressure wet atomization, ultrasonic dispersion, micro fluidizer, and the like. In addition, processes and dispersing machines, described in "Encyclopedia of Dispersion Technology, issued by JOHOKIKO Co., Ltd., Jul. 15, 2005" and "Practical comprehensive data collection on dispersion technology centered on suspension (solid/liquid dispersion system) and industrial application thereof, issued by Publishing Department of Management Development Center, Oct. 10, 1978", can be suitably used. The pigment may be subjected to a fining treatment by a salt milling step. For materials, equipment, processing conditions, and the like used in the salt milling step, those described in, for example, JP2015-194521A and JP2012-046629A can be used.

Among these, the sand mill (beads mill) is preferable. In pulverization of the pigment in the sand mill (beads mill), it is preferable to treat the pigment under a condition of increased pulverization efficiency such as by using beads of small diameter to increase a filling rate of beads, and, after the pulverization treatment, it is also preferable to remove elementary particles by filtration, centrifugation, or the like.

<Method for Preparing Dispersion Composition>

The dispersion composition of the present invention can be prepared by mixing the above-mentioned various components using a known mixing method (for example, a stirrer, a homogenizer, a high pressure emulsification apparatus, a wet type pulverizer, and a wet type dispersing machine).

In a case of preparing the dispersion composition of the present invention, it is preferable to have a step of filtering the dispersion composition with a filter for the purpose of removing foreign matters and reducing defects. In a case of filtering the dispersion composition with a filter, it is more preferable that the dispersion composition is stored by being left to stand and, after the storage, a filtration step is carried out for the dispersion composition. Through the above steps, it is possible not only to reduce the amount of impurities contained in the liquid such as precipitated dispersant, aggregates of cyclic or chain-like polyester compound, but also to adjust a content of the cyclic or chain-like polyester compound, so that generation of foreign matters in a light-shielding film can be further suppressed.

The dispersion composition of the present invention may be prepared by mixing a pigment, a dispersant, and a solvent to prepare a dispersion and then adding a cyclic or chain-like polyester compound to the dispersion. In this case, at least either one of the dispersion composition after the addition of the cyclic or chain-like polyester compound or the dispersion before the addition of the cyclic or chain-like polyester compound is preferably subjected to the above-mentioned filtration (preferably filtration after the storage at low temperature).

<Filtration of Dispersion Composition>

As a filter used for filtration of the dispersion composition, any filter can be used without particular limitation as long as it is used for filtration applications or the like in the related art. Examples of the filter include a fluororesin such as PTFE (polytetrafluoroethylene), a polyamide resin such as nylon, and a polyolefin resin (including a high density and ultra high-molecular-weight polyolefin resin) such as polyethylene and polypropylene (PP). Among these materials, polypropylene (including a high density polypropylene) and nylon are preferable.

A pore diameter of the filter is suitably about 0.1 to 7.0 µm, preferably about 0.2 to 2.5 µm, more preferably about 0,2 to 1.5 µm, and still more preferably 0.3 to 0.7 µm. By being set to this range, it is possible to reliably remove fine foreign matters such as impurities and aggregates contained in a pigment while suppressing filter clogging due to the pigment.

In a case of using a filter, different filters may be combined. In that case, filtering with a first filter may be performed only once or twice or more. In a case where filtering is performed twice or more by combining different filters, it is preferable that a pore diameter in second and subsequent filterings is equal to or larger than a pore diameter in a first filtering. In addition, another first filter having a different pore diameter may also be combined therewith in the above range. Here, a pore diameter can refer to a nominal value of a filter maker. As a commercial filter, for example, it is possible to make a selection from various filters provided by Nihon Pall Ltd., Advantec Toyo Kaisha, Ltd., Nihon Entegris K.K. (formerly Nihon Mykrolis K.K.), KITZ MICROFILTER CORPORATION, and the like.

As a second filter, one made of the same material or the like as the above-mentioned first filter can be used. A pore diameter of the second filter is suitably about 0.2 to 10.0 µm, preferably about 0.2 to 7.0 µm, and more preferably about 0.3 to 6.0 µm.

In particular, it is preferable to filter the dispersion composition after being stored at low temperature for a long time. By doing so, it is possible to more efficiently perform removal of precipitated dispersant, removal of cyclic or chain-like polyester compound, or adjustment of content. In a case where the dispersion composition is stored for a long time at low temperature and then filtered, the dispersion composition may be filtered after storing it at a temperature of −18° C. to 7.5° C. for about 2 to 5 days and then having it returned to room temperature. A storage temperature is preferably −30° C. to 10° C., and more preferably −20° C. to 8° C. In addition, a storage time is preferably 0.1 hours to 14 days, and more preferably 1 day to 7 days.

Means for carrying out removal of precipitated dispersant, removal of cyclic or chain-like polyester compound, or adjustment of content is not limited to the step of filtering with the above-mentioned filter, and may be a separation by centrifugation step or ultrafiltration step.

[Curable Composition]

A curable composition of the present invention includes the above-described dispersion composition, a polymerization initiator, and a polymerizable compound.

<Polymerizable Compound>

The curable composition of the present invention contains a polymerizable compound.

The polymerizable compound is preferably a compound having at least one addition-polymerizable ethylenically unsaturated group and having a boiling point of 100° C. or more at normal pressure.

Examples of the compound having at least one addition-polymerizable ethylenic unsaturated group and having a boiling point of 100° C. or more at normal pressure can include monofunctional acrylate or methacrylate such as polyethylene glycol mono(meth)acrylate, polypropylene glycol mono(meth)acrylate, and phenoxyethyl (meth)acrylate; polyethylene glycol di(meth)acrylate, trimethylol ethane tri(meth)acrylate, neopentyl glycol di(meth)acrylate, pentaerythritol tri(meth)acrylate, pentaerythritol tetra(meth) acrylate, dipentaerythritol hexa(meth)acrylate, hexanediol (meth)acrylate, trimethylolpropane tri(acryloyloxypropyl) ether, and tri(acryloyloxyethyl)isocyanurate. In addition, one obtained by (meth)acrylation after addition of ethylene oxide or propylene oxide to a multifunctional alcohol such as glycerin and trimethylolethane; one obtained by poly (meth)acrylattion of pentaerythritol or dipentaerythritol; urethane acrylates described in JP1973-41708B (JP-S48-41708B), JP1975-6034B (JP-S50-6034B), and JP1976-37193 (JP-S51-37193B); polyester acrylates described in JP1973-64183A (JP-S48-64183A), JP1974-43191B (JP-S49-43191B), and JP1977-30490B (JP-S52-30490B); multifunctional acrylates and methacrylates such as epoxy acrylates which are reaction products of epoxy resins and (meth)acrylic acids; and the like can also be mentioned. Furthermore, those described as photocuring monomers or oligomers in the Journal of the Adhesion Society of Japan, Vol. 20, No. 7, pp. 300 to 308 can also be used.

Further, a compound obtained by (meth)acrylation after addition of ethylene oxide or propyleneoxide to a multifunctional alcohol, which is represented by General Formula (1) and General Formula (2) in JP1998-62986A (JP-H10-62986A), along with specific examples thereof, can also be used.

Among these, a structure in which dipentaerythritol penta (meth)acrylate, dipentaerythritol hexa(meth) acrylate, and acryloyl groups thereof are linked to dipentaerythritol via an ethylene glycol residue or a propylene glycol residue is preferable. Oligomer types thereof can also be used.

Further, urethane acrylates as described in JP1973-41708B (JP-S48-41708B), JP1976-37193A (JP-S51-37193A), JP1990-32293B (JP-H2-32293B), and JP1990-16765B (JP-H2-16765B), or urethane compounds having an ethylene oxide-based skeleton as described in JP1983-49860B (JP-S58-49860B), JP1981-17654B (JP-S56-17654B), JP1987-39417B (JP-S62-39417B), and JP1987-39418B (JP-S62-39418B) are also suitable. Furthermore, by using addition-polymerizable compounds having an amino structure or a sulfide structure in a molecule thereof as described in JP1988-277653A (JP-S63-277653A), JP1988-260909A (JP-S63-260909A), and JP1989-105238A (JP-H1-105238A), it is possible to obtain a photopolymerizable composition which is highly excellent in photosensitive speed. Examples of commercial products include urethane oligomer UAS-10, UAB-140 (trade name, manufactured by Nippon Paper Chemicals Co., Ltd.), UA-7200 (manufactured by Shin-Nakamura Chemical Co., Ltd.), DPHA-40H (trade name, manufactured by Nippon Kayaku Co., Ltd.), UA-306H, UA-306T, UA-306I, AH-600, T-600, AI-600 (trade name, manufactured by Kyoeisha Chemical Co., Ltd).

Further, ethylenically unsaturated compounds having an acid group are also suitable, and examples of commercial products thereof include TO-756 which is a trifunctional acrylate containing a carboxylic acid group and TO-1382 which is a 5-functional acrylate containing a carboxylic acid group, all manufactured by Toagosei Co., Ltd. As the polymerizable compound used in the present invention, a tetrafunctional or higher functional acrylate compound is more preferable.

The polymerizable compounds may be used alone or in combination of two or more thereof.

In a case where two or more polymerizable compounds are used in combination, an embodiment of combination can be appropriately set according to physical properties and the like required for the composition. One suitable embodiment of combination of the polymerizable compounds is, for example, an embodiment in which two or more polymerizable compounds selected from the above-mentioned polyfunctional acrylate compounds are combined, and one example thereof is a combination of dipentaerythritol hexaacrylate and pentaerythritol triacrylate.

A content of the polymerizable compound in the curable composition of the present invention is preferably 3% by mass to 55% by mass, and more preferably 5% by mass to 50% by mass, with respect to the entire solid content in the composition.

<Polymerization Initiator>

The curable composition of the present invention contains a polymerization initiator.

The polymerization initiator is not particularly limited and may be suitably selected from known polymerization initiators. For example, those (so-called photopolymerization initiators) having photosensitivity from an ultraviolet ray region to a visible ray region are preferable. In addition, the polymerization initiator may be an activator which produces an active radical due to some action with a photoexcited sensitizer. Furthermore, the polymerization initiator may be an initiator which initiates cationic polymerization depending on a type of a monomer.

Further, the polymerization initiator preferably contains at least one component having a molecular light absorption coefficient of at least about 50 in a range of about 300 to 800 nm (more preferably 330 to 500 nm).

Examples of the polymerization initiator include a halogenated hydrocarbon derivative (for example, one having a triazine skeleton and one having an oxadiazole skeleton); an acylphosphine compound such as acylphosphine oxide; hexaaryl biimidazole; an oxime compound such as an oxime derivative; an organic peroxide; a thio compound; a ketone compound; an aromatic onium salt; ketoxime ether; an aminoacetophenone compound; and hydroxyacetophenone. More specifically, for example, an aminoacetophenone-based initiator described in JP1998-291969A (JP-1410-291969A) and an acylphosphine oxide-based initiator described in JP4225898B can also be used.

As the hydroxyacetophenone initiator, IRGACURE-184, DAROCUR-1173, IRGACURE-500, IRGACURE-2959, and IRGACURE-127 (all trade names, manufactured by BASF) can be used.

As the aminoacetophenone-based initiator, commercial products IRGACURE-907, IRGACURE-369, and IRGACURE-379 (all trade names: manufactured by BASF) can be used.

As the aminoacetophenone type initiator, compounds described in JP2009-91179A, of which absorption wavelength matches a long wave light source at 365 nm, 405 nm, or the like, can also be used.

As the acylphosphine type initiator, commercial products IRGACURE-819 and DAROCUR-TPO (trade name: manufactured by BASF) can be used.

As the polymerization initiator, an oxime-based initiator (oxime compound) is preferable.

Specific examples of the oxime-based initiator include 2-(O-benzoyloxime)-1-[4-(phenylthio)phenyl]-1,2-butanedione, 2-(O-benzoyloxime)-1-[4-(Phenylthio)phenyl]-1,2-pentanedione, 2-(O-benzoyloxime)-1-[4-(phenylthio)phenyl]-1,2-hexanedione, 2-(O-benzoyloxime)-1-[4-(phenylthio)phenyl]-1,2-heptanedione, 2-(O-benzoyloxime)-1-[4-(phenylthio)phenyl]-1,2-octanedione, 2-(O-2-(O-benzoyloxime)-1-[4-(methylphenylthio)phenyl]-1,2-butanedione, 2-(O-benzoyloxime)-1-[4-(ethylphenylthio)phenyl]-1,2-butanedione, 2-(O-benzoyloxime)-1-[4-(butylphenylthio)phenyl]-1,2-butanedione, 1-(O-acetyloxime)-1-[9-ethyl-6-(2-methylbenzoyl)-9H-carbazol-3-yl]-ethanone, 1-(O-acetyloxime)-1-[9-methyl-6-(2-methylbenzoyl)-9H-carbazole(1-methylbenzoyl)-9H-carbazole-3-yl]ethanone, 1-(O-acetyloxime)-1-[9-propyl-6-(2-methylbenzoyl)-9H-carbazol-3-yl]ethanone, 1-(O-acetyloxime)-1-[9-ethyl-6-(2-ethylbenzoyl)-9H-carbazol-3-yl]ethanone, and 1-(O-acetyloxime)-1-[9-ethyl-6-(2-butylbenzoyl)-9H-carbazol-3-yl]ethanone.

As the oxime-based initiator, commercial products such as TRONLY TR-PBG-304, TRONLY TR-PBG-309, and TRONLY TR-PBG-305 (manufactured by CHANGZHOU TRONLY NEW ELECTRONIC MATERIALS CO., LTD) can be used. In addition, reference is made to description of oxime-based initiators described in paragraph numbers 0092 to 0096 of JP2012-113104A, the contents of which are incorporated herein. By using such oxime-based initiators, it is possible to provide a composition having high curing sensitivity and good developability. The oxime-based initiator is also preferably a compound described in paragraph number 0030 of JP2012-113104A. As a general formula, one represented by General Formula (1) described in claim 1 of JP2012-113104A is mentioned, and one represented by General Formula (1-A) described in claim 3 thereof is more preferable, to which reference can be made, and the contents of which are incorporated herein.

Further, compounds described in J. C. S. Perkin II (1979) 1653-1660, J. C. S. Perkin II (1979) 156-162, Journal of Photopolymer Science and Technology (1995) 202-232, and JP2000-66385A; compounds described in paragraph numbers 0218 to 0281 of JP2000-80068A, and in paragraph numbers 0242 to 0251 of JP2004-534797A; IRGACURE OXE 01 (1,2-octanedione, 1-[4-(phenylthio)-, 2-(O-benzoyloxime)]), IRGACURE OXE 02 (ethanone, 1-[9-ethyl-6-(2-methylbenzoyl)-9H-carbazol-3-yl]-, 1-(O-acetyloxime)), all manufactured by BASF Japan Ltd.; 2-(acetyloxyiminomethyl)thioxanthen-9-one, O-acyloxime compounds (for example, ADEKA OPTOMER N-1919, ADEKA Cruise NCI-831, all manufactured by ADEKA Co., Ltd.), ADEKA Cruise NCI-930, and the like are mentioned, the contents of which are incorporated herein.

Furthermore, cyclic oxime compounds described in paragraph number 0031 of JP2007-231000A and paragraph number 0039 of JP2007-322744A, oxime compounds having specific substituents shown in paragraph numbers 0060 to 0062 of JP2007-269779A, oxime compounds having a thioaryl group shown in paragraph numbers 0090 to 0106 of JP2009-191061A, compounds described in paragraph numbers 0375 to 0409 of JP2001-233842A, and the like are mentioned, the contents of which are incorporated herein.

Further, it is also possible to use oxime-based initiators having a fluorine atom. Specific examples of such initiators include compounds described in JP 2010-262028A, Compounds 24 and 36 to 40 described in paragraph number 0345 of JP2014-500852A, and Compound (C-3) described in paragraph number 0101 of JP2013-164471A.

As the polymerization initiator, oxime compounds represented by Formulas (I) and (II) can also be used.

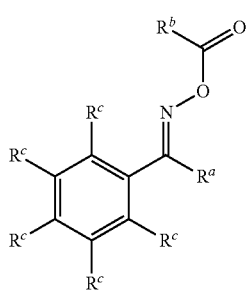

(I)

In Formula (I), $R^a$ represents an alkyl group, an acyl group, an aryl group, or a heterocyclic group, $R^b$ represents an alkyl group, an aryl group, or a heterocyclic group, and a plurality of $R^c$'s each independently represent a hydrogen atom, an alkyl group, or a group represented by —$OR^h$. $R^h$ represents an electron withdrawing group or an alkyl ether group. However, at least one of the plurality of $R^c$'s represents a group represented by —$OR^h$.

In Formula (1), $R^a$ represents an alkyl group, an acyl group, an aryl group, or a heterocyclic group, preferably an aryl group or a heterocyclic group, and more preferably a heterocyclic group.

The number of carbon atoms of the alkyl group is preferably 1 to 20, more preferably 1 to 15, still more preferably 1 to 10, and particularly preferably 1 to 4. The alkyl group may be linear, branched, or cyclic, and is preferably linear or branched.

The number of carbon atoms of the acyl group is preferably 2 to 20, and more preferably 2 to 15. Examples of the acyl group include an acetyl group and a benzoyl group.

The number of carbon atoms of the aryl group is preferably 6 to 20, more preferably 6 to 15, and still more preferably 6 to 10. The aryl group may be a monocyclic ring or a condensed ring.

The heterocyclic group is preferably a 5-membered ring or a 6-membered ring. The heterocyclic group may be a monocyclic ring or a condensed ring. A condensation number is preferably 2 to 8, more preferably 2 to 6, still more preferably 3 to 5, and particularly preferably 3 to 4. The number of carbon atoms constituting the heterocyclic group is preferably 3 to 40, more preferably 3 to 30, and still more preferably 3 to 20. The number of hetero atoms constituting the heterocyclic group is preferably 1 to 3. The hetero atom constituting the heterocyclic group is preferably a nitrogen atom, an oxygen atom, or a sulfur atom, and more preferably a nitrogen atom.

The above-mentioned group represented by $R^a$ may be unsubstituted or may have a substituent. Examples of the substituent include an alkyl group, an aryl group, a heterocyclic group, a nitro group, a cyano group, a halogen atom, —$OR^{X1}$, —$SR^{X1}$, —$COR^{X1}$, —$COOR^{X1}$, —$OCOR^{X1}$, —$NR^{X1}R^{X2}$, —$NHCOR^{X1}$, —$CONR^{X1}R^{X2}$, —$NHCONR^{X1}R^{X2}$, —$NHCOOR^{X1}$, —$SO_2R^{X1}$, —$SO_2OR^{X1}$, and —$NHSO_2R^{X1}$. $R^{X1}$ and $R^{X2}$ each independently represent a hydrogen atom, an alkyl group, an acyl group, or a heterocyclic group.

The halogen atom includes a fluorine atom, a chlorine atom, a bromine atom, and an iodine atom, and a fluorine atom is preferable.

The alkyl group as the substituent, and the alkyl group represented by $R^{X1}$ and $R^{X2}$ preferably have 1 to 20 carbon atoms. The alkyl group may be linear, branched, or cyclic, and is preferably linear or branched. In the alkyl group, a part or all of the hydrogen atoms may be substituted with a halogen atom (preferably a fluorine atom). In addition, in the alkyl group, a part or all of the hydrogen atoms may be substituted with the above substituent.

The number of carbon atoms of the aryl group as the substituent and the aryl group represented by $R^{X1}$ and $R^{X2}$ is preferably 6 to 20, more preferably 6 to 15, and still more preferably 6 to 10. The aryl group may be a monocyclic ring or a condensed ring. In addition, in the aryl group, a part or all of the hydrogen atoms may be substituted with the above substituent.

The heterocyclic group as the substituent, and the heterocyclic group represented by $R^{X1}$ and $R^{X2}$ are preferably a 5-membered ring or a 6-membered ring. The heterocyclic group may be a monocyclic ring or may be a condensed ring. The number of carbon atoms constituting the heterocyclic group is preferably 3 to 30, more preferably 3 to 18, and still more preferably 3 to 12. The number of hetero atoms constituting the heterocyclic group is preferably 1 to 3. The hetero atom constituting the heterocyclic group is preferably a nitrogen atom, an oxygen atom, or a sulfur atom. In addition, in the heterocyclic group, a part or all of the hydrogen atoms may be substituted with the above substituent.

The heterocyclic group represented by $R^a$ is preferably a group represented by Formula (II).

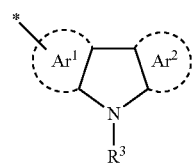

(II)

In Formula (II), $Ar^1$ and $Ar^2$ each independently represent an aromatic hydrocarbon ring which may have a substituent, $R^3$ represents an alkyl group or an aryl group, and * represents a bonding position.

In Formula (II), $Ar^1$ and $Ar^2$ each independently represent an aromatic hydrocarbon ring which may have a substituent.

The aromatic hydrocarbon ring may be a monocyclic ring or a condensed ring. In the aromatic hydrocarbon ring, the number of carbon atoms constituting the ring is preferably 6 to 20, more preferably 6 to 15, and still more preferably 6 to 10. The aromatic hydrocarbon ring is preferably a benzene ring or a naphthalene ring. Among these, at least one of $Ar^1$ or $Ar^2$ is preferably a benzene ring, and $Ar^1$ is more preferably a benzene ring. $Ar^2$ is preferably a benzene ring or a naphthalene ring, and more preferably a naphthalene ring.

Examples of the substituent that $Ar^1$ and $Ar^2$ may have include the substituents described for $R^a$.

$Ar^1$ is preferably unsubstituted. $Ar^1$ may be unsubstituted or may have a substituent. The substituent is preferably —$COR^{X1}$. $R^{X1}$ is preferably an alkyl group, an aryl group, or a heterocyclic group, and more preferably an aryl group. The aryl group may have a substituent and may be unsubstituted. Examples of the substituent include an alkyl group having 1 to 10 carbon atoms.

In Formula (II), $R^3$ represents an alkyl group or an aryl group, and the alkyl group is preferable. The alkyl group and the aryl group may be unsubstituted or may have a substituent. Examples of the substituent include the substituents described for the above-mentioned $R^a$.

The number of carbon atoms of the alkyl group is preferably 1 to 20, more preferably 1 to 15, and still more preferably 1 to 10. The alkyl group ay be linear, branched, or cyclic, and is preferably linear or branched.

The number of carbon atoms of the aryl group is preferably 6 to 20, more preferably 6 to 15, and still more preferably 6 to 10. The aryl group may be a monocyclic ring or a condensed ring.

In Formula (I), $R^b$ represents an alkyl group, an aryl group, or a heterocyclic group; an alkyl group or aryl group is preferable; and an alkyl group is more preferable. The alkyl group, aryl group, and heterocyclic group have the same meanings as those described for $R^a$. These groups may be unsubstituted or may have a substituent. Examples of the substituent include the substituents described for $R^a$.

In Formula (I), a plurality of $R^c$'s each independently represent a hydrogen atom, an alkyl group, or a group represented by —$OR^h$. $R^h$ represents an electron withdrawing group or an alkyl ether group. However, at least one of the plurality of $R^c$'s represents a group represented by —$OR^h$.

The number of carbon atoms of the alkyl group represented by $R^c$ is preferably 1 to 20, more preferably 1 to 15, still more preferably 1 to 10, and particularly preferably 1 to 4. The alkyl group may be linear, branched, or cyclic, and is preferably linear or branched.

Examples of the electron withdrawing group represented by $R^h$ in —$OR^h$ include a nitro group, a cyano group, a fluorine atom, and an alkyl group having 1 to 20 carbon atoms in which at least one hydrogen atom is substituted with a fluorine atom.

Among these, an alkyl group having 1 to 20 carbon atoms in which at least one hydrogen atom is substituted with a fluorine atom is preferable. The number of carbon atoms of the alkyl group is preferably 1 to 15, more preferably 1 to 10, and still more preferably 1 to 4. In addition, the alkyl group may be linear, branched, or cyclic, and is preferably linear or branched.

The alkyl ether group represented by $R^h$ in —$OR^h$ means an alkyl group substituted with an alkoxy group. The alkyl group in the alkyl ether group, and the alkoxy group in the alkyl ether group preferably have 1 to 20 carbon atoms, more preferably 1 to 15 carbon atoms, still more preferably 1 to 10 carbon atoms, and particularly preferably 1 to 4 carbon atoms. The alkyl group may be linear, branched, or cyclic, and is preferably linear or branched.

A total number of carbon atoms of the alkyl ether group is preferably 2 to 8, more preferably 2 to 6, and still more preferably 2 to 4.

One or two of the plurality of $R^c$'s are preferably a group represented by —$OR^h$. In this case, in a case where $R^h$ in —$OR^h$ is an electron-withdrawing group (for example, an alkyl group having 1 to 20 carbon atoms in which at least one hydrogen atom is substituted with a fluorine atom), the remaining $R^c$'s are preferably hydrogen atoms. On the other hand, in a case where $R^h$ in —$OR^b$ is an alkyl ether group, it is preferable that one of the remaining $R^c$'s is an alkyl group and the others are hydrogen atoms.

Further, in the benzene ring to Which $R^c$ is bonded, the alkyl group represented by or the group represented by —$OR^h$ is preferably located at an ortho or para position to one carbon atom to which $R^c$ is not bonded.

Specific examples of a photopolymerization initiator represented by Formula (I) or Formula (II) include, for example, the following compounds.

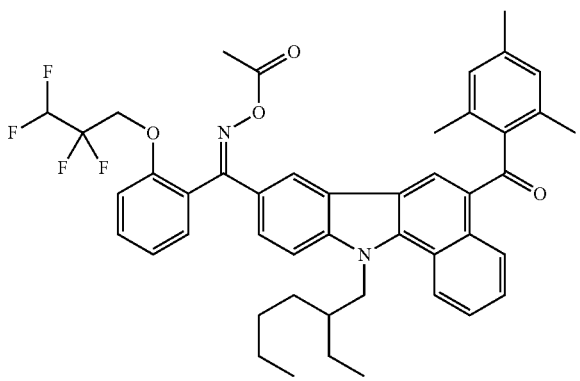

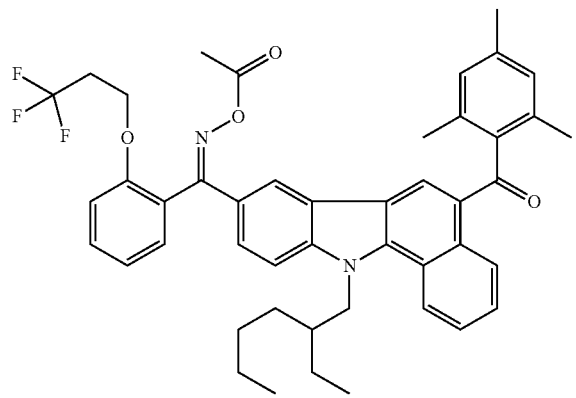

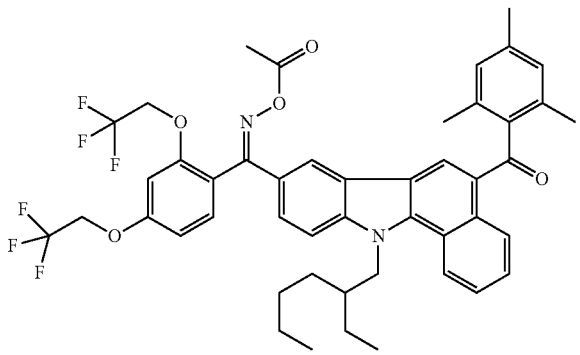

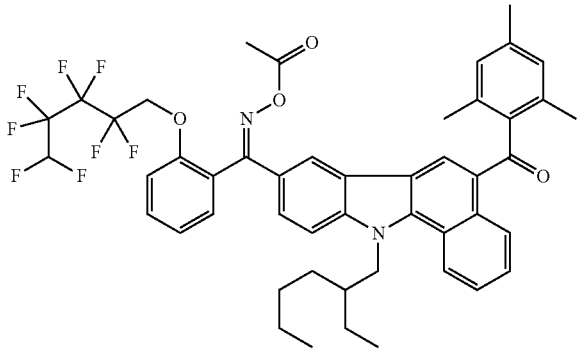

-continued

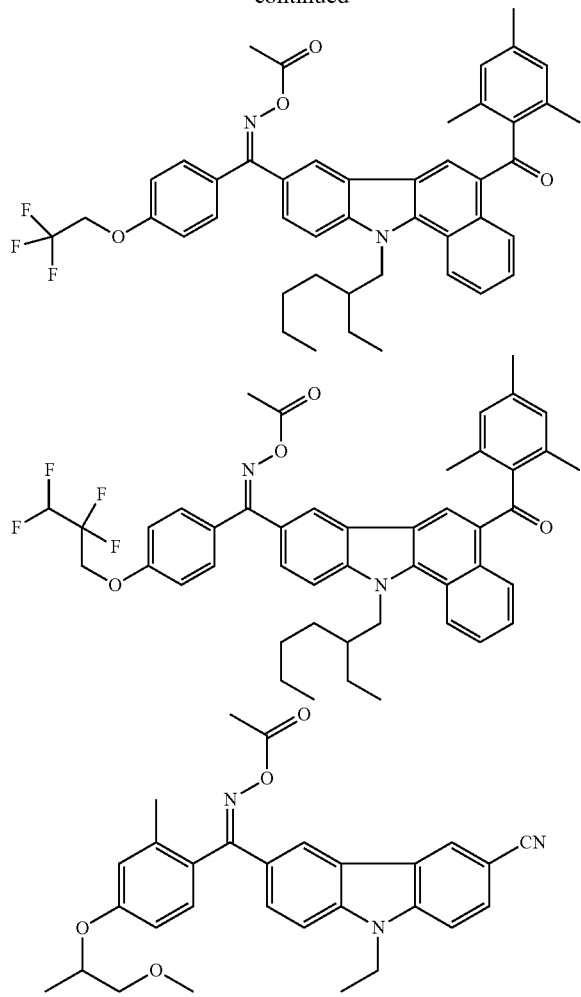

A content of the polymerization initiator in the curable composition of the present invention is preferably 0.1% to 30% by mass more preferably 1% to 25% by mass, and still more preferably 1% to 10% by mass, with respect to the entire solid content in the composition.

<Binder Polymer>

The curable composition of the present invention may contain a binder polymer.

As the binder polymer, a linear organic polymer is preferably used. As such linear organic polymer, known ones can be used in a predetermined manner. Preferably, a linear organic polymer which is soluble or swellable in water or weakly alkaline water is selected so as to allow for water development or weakly alkaline water development. Among these, as the binder polymer, an alkali-soluble resin (a resin having a group that promotes alkali solubility) is particularly preferable.

It is preferable that the binder polymer is appropriately selected from alkali-soluble resins having at least one alkali solubility-promoting group in a molecule thereof (the molecule preferably having a (meth)acrylic copolymer or a styrene-based copolymer as a main chain). From the viewpoint of heat resistance, a polyhydroxystyrene-based resin, a polysiloxane-based resin, a (meth)acrylic resin, a (meth) acrylamide-based resin, or a (meth)acrylic/(meth)acrylamide copolymer resin is preferable; and from the viewpoint of control of developability, a (meth)acrylic resin, a (meth) acrylamide resin, or a meth)acrylic/(meth)acrylamide copolymer resin is preferable.

Examples of the group that promotes alkali solubility (hereinafter also referred to as an acid group) include a carboxylic acid group, a phosphoric acid group, a sulfonic acid group, and a phenolic hydroxyl group, and the carboxylic acid group is preferable. These acid groups may be used alone or in combination of two or more thereof.

Further, those soluble in an organic solvent and developable with a weak alkaline aqueous solution are preferable, and a binder polymer having a repeating unit derived from (meth)acrylic acid is preferable.

Examples of the binder polymer include radical polymers having a carboxylic acid group in a side chain, for example, those described in JP1984-44615A (JP-S59-44615A), JP1979-34327B (JP-S54-34327B), JP1983-12577B (JP-S58-12577B), JP1979-25957B (JP-S54-25957B), JP1979-92723A (JP-S54-92723A), JP1984-53836A (JP-S59-53836A), and JP1984-71048A (JP-S59-71048A), that is, a resin obtained by homopolymerizing or copolymerizing a monomer having a carboxylic acid group, a resin obtained by homopolymerizing or copolymerizing a monomer having an acid anhydride and subjecting the acid anhydride unit to hydrolysis, half-esterification, or half-amidation, and an epoxy acrylate obtained by modifying an epoxy resin with an unsaturated monocarboxylic acid and an acid anhydride. Examples of the monomer having a carboxylic acid group include acrylic acid, methacrylic acid, itaconic acid, crotonic acid, maleic acid, fumaric acid, and 4-carboxylstyrene; and examples of the monomer having an acid anhydride include maleic acid anhydride. In addition, similarly, an acidic cellulose derivative having a carboxylic acid group in a side chain is mentioned as an example. Besides, those obtained by adding a cyclic acid anhydride to a polymer having a hydroxyl group are useful.

Further, acetal-modified polyvinyl alcohol-based binder polymers having an acid group which is described in EP993966B, EP1204000B, JP2001-318463A, and the like, are suitable due to an excellent balance between light-shielding film strength and developability.

Furthermore, as other water-soluble linear organic polymers, polyvinyl pyrrolidone and polyethylene oxide are useful. In addition, in order to increase the light-shielding film strength, alcohol-soluble nylon, a condensation reaction product of 2,2-bis-(4-hydroxyphenyl)-propane and epichlorohydrin, and the like are also useful.

In particular, among these, [benzyl (meth)acrylate/(meth) acrylic acid/other addition polymerizable vinyl monomer as necessary] copolymers and [allyl (meth)acrylate/(meth) acrylic acid/other addition polymerizable vinyl monomer as necessary] copolymers are suitable due to an excellent balance among light-shielding film strength, sensitivity, and developability.

Examples of commercial products thereof include Acrylic Base FF-187, FF-426 (manufactured by Fujikura Kasei Co., Ltd.), Acricure-RD-F8 (Nippon Shokubai Co., Ltd.), and CyclomerP(ACA) 230AA manufactured by Daicel-Allnex Ltd.

For the manufacture of the binder polymer, for example, a method according to a known radical polymerization method can be applied. Polymerization conditions such as temperature, pressure, type and amount of a radical initiator, and type of a solvent during manufacture of an alkali-soluble resin with a radical polymerization method can be easily set by those skilled in the art.

A content of the binder polymer in the curable composition of the present invention is preferably 0.1% to 30% by mass, and more preferably 0.3% to 25% by mass, with respect to the entire solid content of the curable composition.

<Others>

The curable composition of the present invention may contain an ultraviolet ray absorber. Thus, more excellent (delicate) shape of pattern can be obtained.

As the ultraviolet ray absorber, salicylate-based, benzophenone-based, benzotriazole-based, substituted acrylonitrile-based, and triazine-based ultraviolet absorbers can be used. As specific examples thereof, compounds of paragraph numbers 0137 to 0142 of JP2012-068418A (paragraph numbers 0251 to 0254 of corresponding US2012/0068292) can be used, the contents of which can be cited and are incorporated herein.

Further, a diethylamino-phenylsulfonyl-based ultraviolet ray absorber (manufactured by Daito Chemical Co., Ltd., trade name: UV-503) and the like are also suitably used.

Examples of the ultraviolet ray absorber include compounds exemplified in paragraph numbers 0134 to 0148 of JP2012-32556A.

In a case where the curable composition contains an ultraviolet ray absorber, a content of the ultraviolet absorber is preferably 0.001% to 15% by mass, more preferably 0.01% to 10% by mass, and still more preferably 0.1% to 5% by mass, with respect to the entire solid content of the composition.

Various surfactants may be contained in the curable composition from the viewpoint of further improving coatability. As the surfactant, various surfactants such as a fluorine-based surfactant, a nonionic surfactant, a cationic surfactant, an anionic surfactant, and a silicone-based surfactant can be used. In particular, since the curable composition of the present invention contains a fluorine-based surfactant, liquid properties (particularly, fluidity) are further improved, so that uniformity of coating thickness and liquid saving properties can be further improved.

Examples of the fluorine-based surfactant include MEGAFAC F171, F172, F173, F176, F177, F141, F142, F143, F144, R30, F437, F475, F479, F482, F554, F780, RS-72-K (all manufactured by DIC Ltd.), Fluorad FC430, FC431, FC171 (all manufactured by Sumitomo 3M Limited), Surflon S-382, SC-101, SC-103, SC-104, SC-105, SC1068, SC-381, SC-383, S393, and KH-40 (all manufactured by Asahi Glass Co., Ltd.), PF636, PF656, PF6320, PF6520, and PF7002 (all manufactured by OMNOVA). As the fluorine-based surfactant, compounds described in paragraph numbers 0015 to 0158 of JP2015-117327A can also be used. As the fluorine-based surfactant, a block polymer can also be used, and specific examples thereof include compounds described in JP2011-89090A.

As the fluorine-based surfactant, a fluorine-containing polymer compound containing a repeating unit derived from a (meth)acrylate compound having a fluorine atom and a repeating unit derived from a (meth)acrylate compound having 2 or more (preferably 5 or more) alkyleneoxy groups (preferably ethyleneoxy group or propyleneoxy group) can also be preferably used, and the following compounds are also exemplified as the fluorine-based surfactant used in the present specification. Meanwhile, * in the compounds represents a bonding moiety.

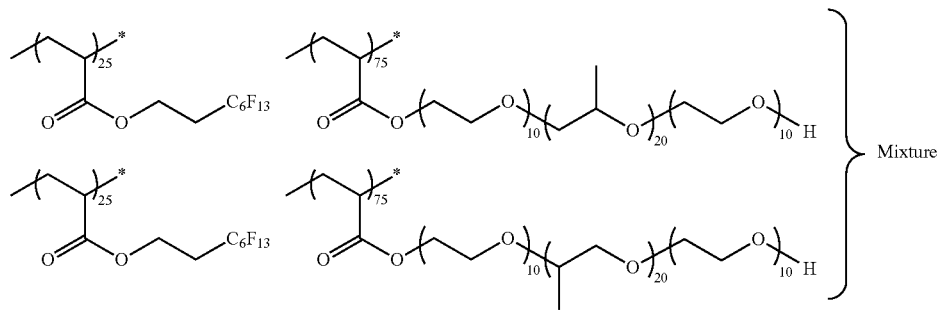

A weight average molecular weight of the above compound preferably 3,000 to 50,000, for example, 14,000.

For the fluorine-based surfactant, a fluorine-containing polymer having an ethylenically unsaturated group in a side chain can also be used as a fluorine-based surfactant. Specific examples thereof include compounds described in paragraph numbers 0050 to 0090 and paragraph numbers 0289 to 0295 of JP2010-164965A, such as MEGAFAC RS-101, RS-102, and RS-718K, all manufactured by DIC Corporation.

Specific examples of other surfactants include surfactants described in paragraph numbers 0174 to 0177 of JP2013-249417A, the contents of which are incorporated herein.

The surfactants may be used alone or in combination of two or more thereof.

A content of the surfactant is preferably 0.001% to 2.0% by mass, or more preferably 0.005% to 1.0% by mass, with respect to the entire mass of the composition.

In addition to the above components, the curable composition may contain the following components. Examples thereof include a sensitizer, a co-sensitizer, a crosslinking agent, a curing accelerator, a filler, a heat-curing accelerator, a polymerization inhibitor, a plasticizer, a diluent, a pigment derivative, and an oil sensitizer. Furthermore, known additives such as an adhesion promoter to a surface of a base material and other auxiliary agents (for example, conductive particles, fillers, defoaming agents, flame retardants, leveling agents, peeling accelerators, antioxidants, perfumes, surface tension adjusting agents, and chain transfer agents) may be contained in the curable composition, as necessary.

For these components, reference can be made to paragraph numbers 0183 to 0228 of JP2012-003225A (<0237> to <0309> of corresponding US Patent Appl. No. 2013/0034812), paragraph numbers 0101 to 0102, paragraph numbers 0103 to 0104, and paragraph numbers 0107 to 0109 of JP2008-2500744, and paragraph numbers 0159 to 0184 of JP2013-195480A, the contents of which are incorporated herein.

A concentration of solid contents of the curable composition of the present invention is preferably 5% to 50% by mass, and more preferably 15% to 40% by mass, from the viewpoint of balance between thickness of pigment layer to be formed and light-shielding properties.

<Method for Preparing Curable Composition>

The curable composition of the present invention can be prepared by mixing the above-mentioned various components using a known mixing method (for example, a stirrer, a homogenizer, a high pressure emulsifying apparatus, a wet type pulverizing machine, and a wet type dispersing machine).

Further, in a case of preparing the curable composition of the present invention, it is preferable to have a step of filtering the curable composition with a filter for the purpose of removing foreign matters and reducing defects. In particular, it is more preferable that the curable composition is stored at low temperature for a long period, and, after the storage, a filtration step is carried out for the curable composition. A filtration method of the curable composition is the same as the above-described method for preparing the dispersion composition, and the same is also applied to suitable embodiments thereof.

Furthermore, the curable composition of the present invention preferably does not contain impurities such as metal, metal salt containing halogen, acid, or alkali. A content of impurities contained in these materials is preferably 1 ppm or less, more preferably 1 ppb or less, still more preferably 100 ppt or less, and particularly preferably 10 ppt or less. It is particularly preferable that substantially no (not more than detection limits of a measurement apparatus) impurities are contained.

Examples of a method of removing impurities such as metal from various materials include filtration using a filter and purification step by distillation (in particular, thin film distillation, molecular distillation, or the like). Examples of the purification step by distillation include those described in, for example, "<Factory Operation Series> Enlarged/Distillation, issued on Jul. 31, 1992, Chemical industry Co., Ltd., and "Chemical Engineering Handbook, Sep. 30, 2004, Asakura Shoten, pages 95 to 102". A filter pore diameter is preferably 10 nm or less, more preferably 5 nm or less, and still more preferably 3 nm or less. As a material of the filter, filters made of polytetrafluoroethylene, polyethylene, or nylon are preferable. The filter may be made of a composite material in which these materials are combined with ion exchange media. The filter may be pre-cleaned with an organic solvent. In a filter filtration step, a plurality of types of filters may be connected in series or in parallel and used. In a case where the plurality of filters are used, filters having different pore diameters and/or different materials may be used in combination. In addition, various materials may be filtered a plurality of times, and the step of filtering a plurality of times may be a circulation filtration step.

Further, examples of a method of reducing impurities such as metal contained in various materials include a method of selecting a raw material having a small metal content as a raw material constituting various materials, a method of filtering a raw material constituting various materials, and a method of performing distillation under a condition in which contamination is suppressed as much as possible by lining an inside of an apparatus with Teflon®, and the like. Preferred conditions for filter filtration performed on raw materials constituting various materials are the same as the above-mentioned conditions.

In addition to filter filtration, impurities may be removed with an adsorbent, or a combination of filter filtration and adsorbent may be used. As the adsorbent, a known adsorbent can be used. For example, inorganic adsorbents such as silica gel and zeolite, and organic adsorbents such as activated carbon can be used.

[Light-Shielding Film]

In a case where the black pigment is used as a colorant, a cured film formed by curing the above-mentioned curable composition can be suitably applied as a so-called light-shielding film.

A thickness of the light-shielding film is not particularly limited, and is preferably 0.2 to 25 µm, and more preferably 1.0 to 10 µm.

The thickness is an average thickness, which is a value obtained by measuring thickness at any five or more points of the light-shielding film and carrying out arithmetic averaging therefor.

A method for manufacturing the light-shielding film is not particularly limited, and examples thereof include a method of manufacturing a light-shielding film by coating the above-mentioned curable composition on a substrate to form a coating film and subjecting the coating film to a curing treatment.

A method for the curing treatment is not particularly limited, and examples thereof include photocuring treatment or heat-curing treatment. From the viewpoint of facilitating pattern formation, the photocuring treatment (particularly, ultraviolet ray irradiation treatment) is preferable.

There are no particular limitations on a type of the substrate to be used, and preferred examples thereof include various members in a solid-state imaging device (for example, an infrared light cut filter, an outer peripheral portion of a solid-state imaging device, an outer peripheral portion of a wafer level lens, and a rear surface of a solid-state imaging device).

In a case of manufacturing a patterned light-shielding film, examples of a suitable embodiment include an embodiment which includes a step of applying the curable composition of the present invention on a substrate to form a composition layer (pigment layer) (hereinafter appropriately abbreviated as "composition layer-forming step"), a step of exposing the composition layer through a mask (hereinafter appropriately abbreviated as "exposure step"), and a step of developing the composition layer after exposure to form a light-shielding film (patterned light-shielding film) (hereinafter appropriately abbreviated as "developing step").

Specifically, a patterned light-shielding film can be manufactured by applying the curable composition of the present invention on a substrate directly or via another layer to form a composition layer (composition layer-forming step), exposing the composition layer through a predetermined mask pattern, curing only a portion of the composition layer which has been irradiated with light (exposure step), and developing the light-irradiated composition layer with a developer (developing step).

The respective steps in the above embodiment will be described below.

[Composition Layer-Forming Step]

In the composition layer-forming step, the curable composition of the present invention is coated on a substrate to form a composition layer.

Examples of a coating method of the curable composition of the present invention on a substrate include various coating methods such as slit coating, ink jet method, spin coating, cast coating, roll coating, and screen printing method.

The curable composition coated on the substrate is usually dried under a condition of a temperature of 0° C. or higher and 110° C. or lower for about 2 minutes or more and about 4 minutes or less to form a composition layer.

[Exposure Step]

In the exposure step, the composition layer formed in the composition layer-forming step is exposed through a mask, and only the composition layer portion irradiated with light is cured.

Exposure is preferably performed by irradiation with radiation. As the radiation, in particular, ultraviolet rays such as g rays, h rays, or i rays are preferably used. In addition, as a light source, a high-pressure mercury lamp is preferable. An irradiation intensity is preferably 5 mJ/cm$^2$ or more and 1,500 mJ/cm$^2$ or less, and more preferably 10 mJ/cm$^2$ or more and 1,000 mJ/cm$^2$ or less.

[Developing Step]

Following the exposure step, developing treatment (developing step) is performed, and an unirradiated portion in the exposure step is eluted into a developer (for example, an alkaline aqueous solution). Thus, only a photocured portion remains.

As the developer, an organic alkali developer is preferable. A developing temperature is usually 20° C. or more and 30° C. or less, and a developing time is 20 seconds or more and 90 seconds or less.

Examples of the alkaline aqueous solution include an inorganic developer and an organic developer. Examples of the inorganic developer include an aqueous solution in which sodium hydroxide, potassium hydroxide, sodium carbonate, sodium hydrogen carbonate, sodium silicate, or sodium metasilicate is dissolved at a concentration of 0.001% to 10% by mass, preferably 0.005% to 1.0% by mass, and particularly preferably 0.01% to 0.6% by mass. Examples of the organic alkali developer include an aqueous solution in which an alkaline compound such as ammonia water, ethylamine, diethylamine, dimethylethanolainine, tetrameklammonium hydroxide, tetraethylammonitun hydroxide, tetrapropylammonium hydroxide, tetrabutylaminonium hydroxide, benzyltrimethylammonium hydroxide, choline, pyrrole, piperidine, or 1,8-diazabicyclo-[5,4,0]-7-undecene is dissolved at a concentration of 0.001% to 10% by mass, and preferably 0.005% to 0.5% by mass. A suitable amount of a water-soluble organic solvent such as methanol and ethanol, and/or a surfactant may be contained in the alkaline aqueous solution. In a case of using a developer composed of such aqueous alkaline solution, it is generally preferable to clean (rinse) the light-shielding film with pure water after development.

After performing the composition layer-forming step, the exposing step, and the developing step, a curing step of curing the formed patterned light-shielding film by heating and/or exposure may be carried out, as necessary.

<Infrared Light Cut Filter and Solid-State Imaging Device, Each Having Light-Shielding Film>

In a case where a black pigment is used as a colorant, the above-mentioned cured film can be suitably applied as a so-called light-shielding film. In addition, such light-shielding film can be suitably applied to a solid-state imaging device.

Hereinafter, firstly, a first embodiment of the solid-state imaging device having the light-shielding film of the present invention will be described in detail.

Figure 2:
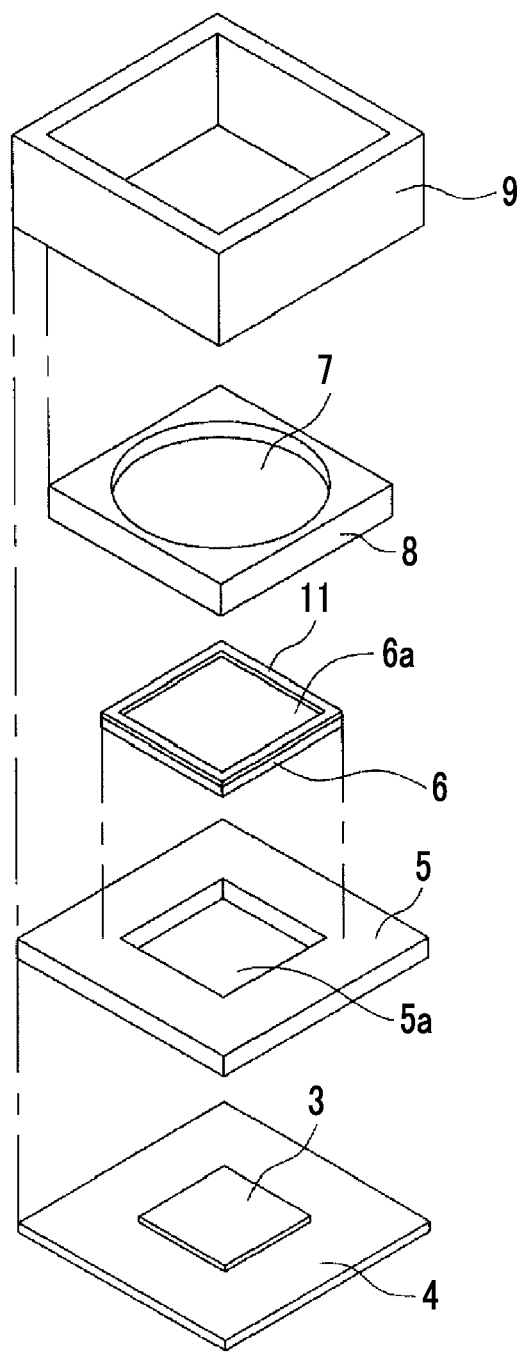
FIG. 2 is an exploded perspective view of the solid-state imaging device according to the first embodiment.

As shown in FIGS. 1 and 2, a solid-state imaging device 2 includes a CMOS sensor 3 as a solid-state imaging device, a circuit board 4 on which the CMOS sensor 3 is mounted, and a ceramic substrate 5 which is made of ceramic and holds the circuit board 4. In addition, the solid-state imaging device 2 further includes an IR cut filter 6 which is held by the ceramic substrate 5 and cuts off infrared light (IR) directed toward the CMOS sensor 3, a taking lens 7, a lens holder 8 holding the taking lens 7, and a holding cylinder 9 for movably holding the lens holder 8. In addition, instead of the CMOS sensor 3, a CCD sensor or an organic CMOS sensor may be provided.

The ceramic substrate 5 has an opening 5a into which the CMOS sensor 3 is inserted, has a frame shape, and surrounds a side surface of the CMOS sensor 3. In this state, the circuit board 4 on which the CMOS sensor 3 is mounted is fixed to the ceramic substrate 5 by an adhesive (for example, an epoxy-based adhesive, which is the same hereinafter). On the circuit board 4, various circuit patterns are formed.

In the IR cut filter 6, a reflection film that reflects infrared light is formed on a plate-shaped glass or blue glass, and a surface on which this reflection film is formed is an incident surface 6a. The IR cut filter 6 is formed in a somewhat larger size than the opening 5a and fixed to the ceramic substrate 5 with an adhesive so as to cover the opening 5a.

The CMOS sensor 3 is disposed behind the taking lens 7 (lower part in FIGS. 2 and 3), and an IR cut filter 6 is disposed between the taking lens 7 and the CMOS sensor 3. The subject light enters a light receiving surface of the CMOS sensor 3 through the taking lens 7 and the IR cut filter 6. At this time, the infrared light is cut by the IR cut filter 6.

The circuit board 4 is connected to a controller provided in an electronic device (for example, a digital camera) on which the solid-state imaging device 2 is mounted, and electric power is supplied from the electronic device to the solid-state imaging device 2. In the CMOS sensor 3, a large number of color pixels are two-dimensionally arranged on the light receiving surface, and each color pixel photoelectrically converts incident light and accumulates the generated signal electric charges.

Figure 3:
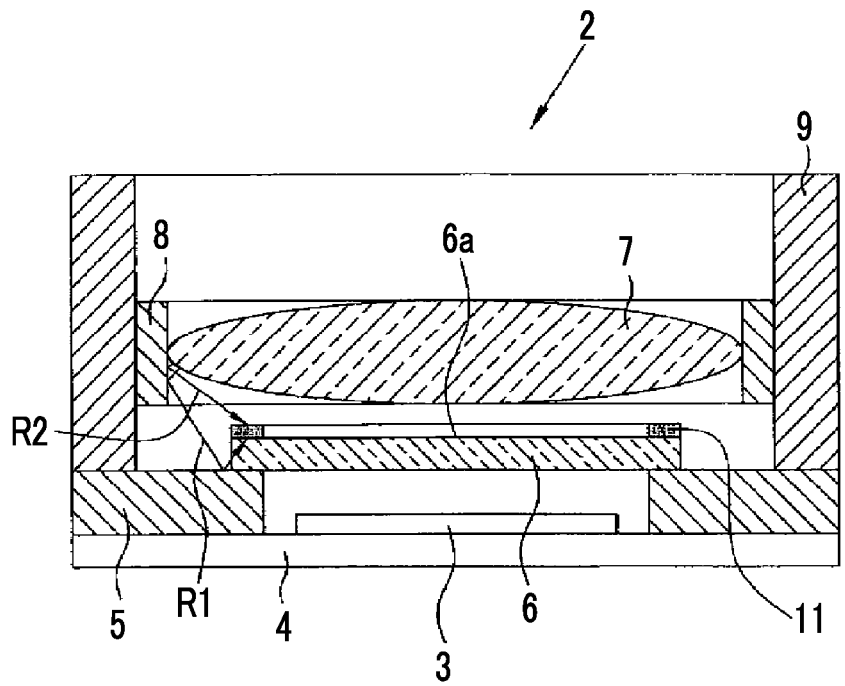
FIG. 3 is a cross-sectional view showing the solid-state imaging device according to the first embodiment.

As shown in FIGS. 2 and 3, the light-shielding film (light-shielding layer) 11 as described above is disposed on an end portion of the incident surface 6a of the IR cut filter 6 over the entire circumference thereof, so that an infrared light cut filter with a light-shielding film is formed. In a case where a reflected light R1 emitted from the taking lens 7 and reflected on a front surface (upper surface in FIGS. 2 and 3) of the ceramic substrate 5 is incident on the CMOS sensor 3 after being repeatedly reflected in the device, and in a case where a reflected light R2 reflected from an inner wall surface of the lens holder 8 emitted from the taking lens 7 is incident on the CMOS sensor 3, this causes occurrence of flare in a taken image. The light-shielding film 11 shields harmful light, such as the reflected light R1 or R2 which is directed toward the CMOS sensor 3. The light-shielding film 11 is coated by, for example, a spin coating method or a spray coating method. In FIGS. 2 and 3, a thickness of the light-shielding film 11 is exaggeratedly drawn.

Figure 4:
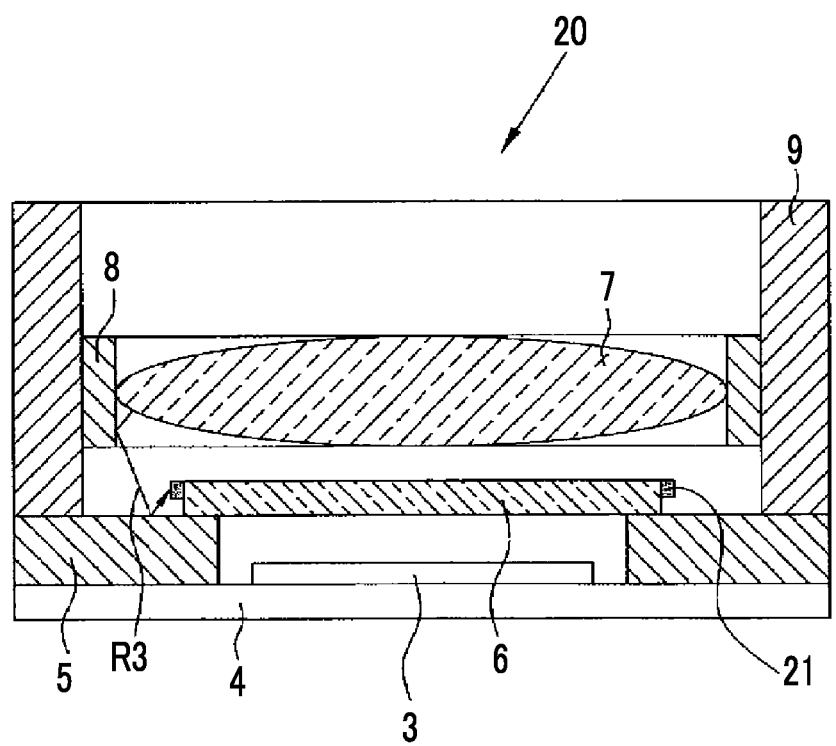
FIG. 4 is a cross-sectional view showing a solid-state imaging device according to a second embodiment.

FIG. 4 shows a solid-state imaging device 20 according to a second embodiment. Constituent members similar to those of the first embodiment are denoted by the same reference numerals, and detailed descriptions thereof will be omitted.

The solid-state imaging device 20 includes a CMOS sensor 3, a circuit board 4, a ceramic substrate 5, an IR cut filter 6, a taking lens 7, a lens holder 8, and a holding cylinder 9. A light-shielding film (light-shielding layer) 21 as described above is formed on a side end face of the IR cut filter 6 over the entire circumference thereof. In a case where a reflected light R3 emitted from the taking lens 7 and reflected on a front surface of the ceramic substrate 5 is incident on the CMOS sensor 3 after being repeatedly reflected in the device, this causes occurrence of flare in a taken image. The light-shielding film 21 shields harmful light such as the reflected light R3 which is directed toward the CMOS sensor 3.

Figure 5:
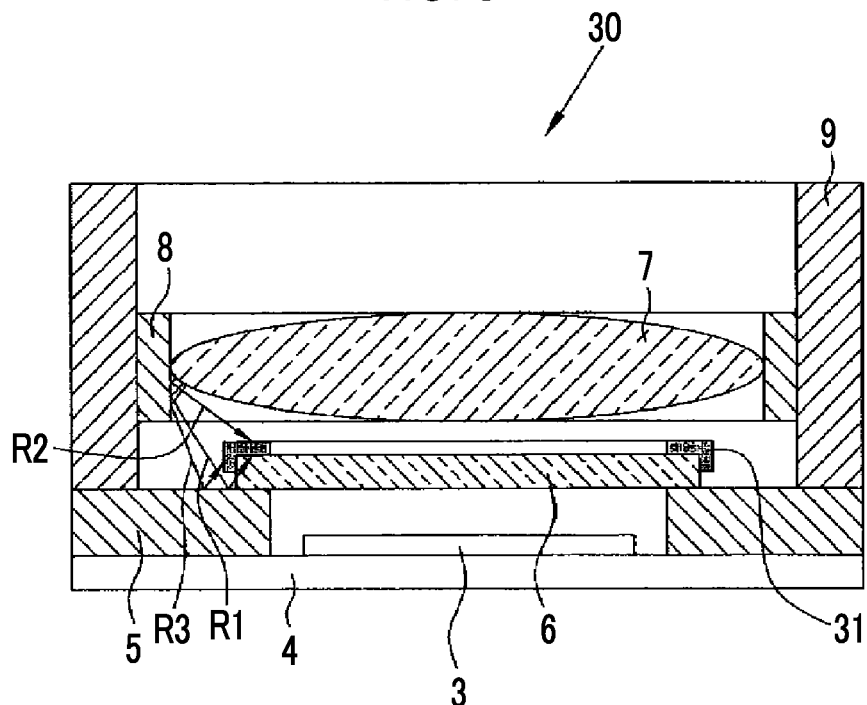
FIG. 5 is a cross-sectional view showing a solid-state imaging device according to a third embodiment.

FIG. 5 shows a solid-state imaging device 30 according to a third embodiment. Constituent members similar to those of the first embodiment are denoted by the same reference numerals, and detailed descriptions thereof will be omitted.

The solid-state imaging device 30 includes a CMOS sensor 3, a circuit board 4, a ceramic substrate 5, an IR cut filter 6, a taking lens 7, a lens holder 8, and a holding cylinder 9. The light-shielding film (light-shielding layer) 31 as described above is formed on an end portion and a side end surface of the incident surface 6a of the IR cut filter 6 over the entire circumferences thereof. That is, the third embodiment is a combination of the first and second embodiments. In the present embodiment, since a higher light-shielding performance is achieved than in the first and second embodiments, occurrence of flare is reliably suppressed.

Figure 6:
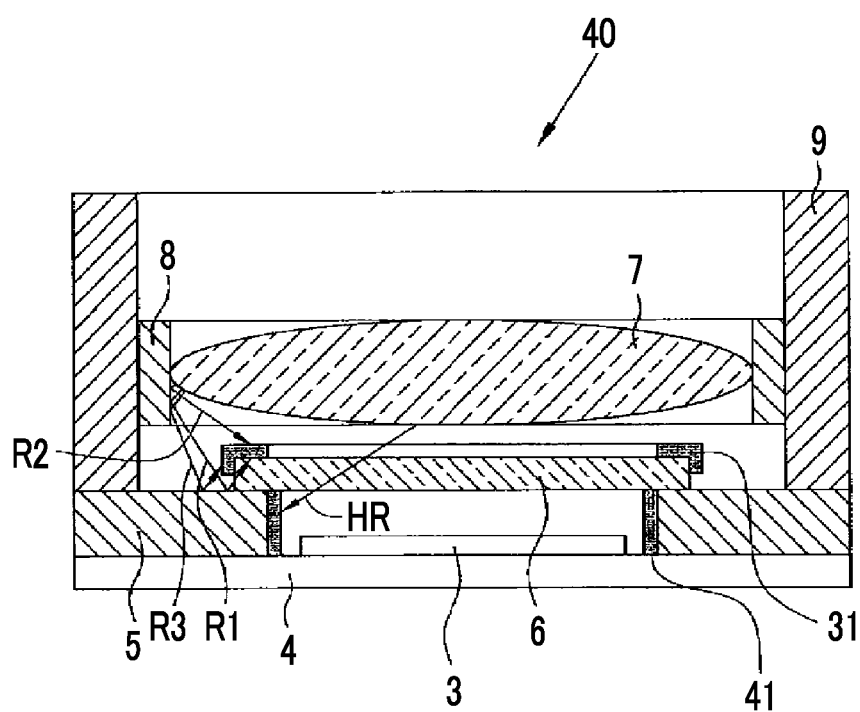
FIG. 6 is a cross-sectional view showing a solid-state imaging device according to a fourth embodiment.

FIG. 6 shows a solid-state imaging device 40 according to a fourth embodiment. Constituent members similar to those of the first embodiment are denoted by the same reference numerals, and detailed descriptions thereof will be omitted.

The solid-state imaging device 40 includes a CMOS sensor 3, a circuit board 4, a ceramic substrate 5, an IR cut filter 6, a taking lens 7, a lens holder 8, and a holding cylinder 9. The light-shielding film (light-shielding layer) 31 as described above is formed on an end portion and a side end surface of the incident surface 6a of the IR cut filter 6 over the entire circumferences thereof.

Further, on an inner wall surface of the ceramic substrate 5, a light-shielding film (light-shielding layer) 41 is formed. In a case where a reflected light, which is emitted from the taking lens 7, passes through the IR cut filter 6, and is reflected on the inner wall surface of the ceramic substrate 5, is incident on the CMOS sensor 3, this causes occurrence of flare in a taken image. Since the light-shielding film 41 has a higher light-shielding performance than the inner wall surface of the ceramic substrate 5, occurrence of flare is reliably suppressed.

<Color Filter>

Further, a cured film formed using the curable composition of the present invention can also be used for a color filter.

The color filter can be suitably used for a solid-state imaging device such as a charge coupled device (CCD) and a complementary metal oxide semiconductor (CMOS), and is particularly suitable for CCD and CMOS, and the like, having a high resolution that exceeds 1 million pixels. The color filter can be, for example, disposed between a light receiving portion of each of pixels constituting the CCD or CMOS and a microlens for focusing and used.

Further, the color filter can be preferably used for an organic electroluminescence (organic EL) element. As the organic EL element, a white organic EL element is preferable. The organic EL element preferably has a tandem structure. Regarding the tandem structure of the organic EL element, reference is made to descriptions in JP2003-45676A, "Frontiers of Organic EL Technology Development—High Brightness, High Accuracy, Prolonged Lifetime, Know-How Collection", supervised by Akiyoshi Mikami, Technical Information Institute Co., Ltd., pages 326-328, 2008, and the like. Examples of the tandem structure of the organic EL element include a structure in which an organic EL layer is provided between a lower electrode having light reflectivity and an upper electrode having light transmittance, on one surface of a substrate. The lower electrode is preferably made of a material having sufficient reflectance in a wavelength range of visible light. It is preferable that the organic EL layer includes a plurality of light emitting layers and has a stacked structure (tandem structure) in which the plurality of light emitting layers are stacked. In the organic EL layer, for example, the plurality of light emitting layers can include a red light emitting layer, a green light emitting layer, and a blue light emitting layer. In addition to the plurality of light emitting layers, it is preferable to have a plurality of light emitting auxiliary layers for causing the light emitting layers to emit light. For example, the organic EL layer can have a stacked structure in which the light emitting layers and the light emitting auxiliary layers are alternately stacked. An organic EL element having the organic EL layer having such a structure can emit white light. In that case, a spectrum of the white light emitted by the organic EL element is preferably one having a strong maximum emission peak in a blue region (430 nm to 485 nm), a green region (530 nm to 580 nm), and a yellow region (580 nm to 620 nm). It is more preferable that in addition to these emission peaks, the spectrum has a maximum emission peak in a red region (650 nm to 700 nm). By combining the organic EL element (white organic EL element) that emits white light with the color filter of the present invention, spectrum having excellent color reproducibility can be obtained and sharper videos or images can be displayed.

A thickness of a colored pattern (colored pixel) in the color filter is preferably 2.0 µm or less, more preferably 1.0 µm or less, and still more preferably 0.7 µm or less. A lower limit can be, for example, 0.1 µm or more, and can be 0.2 µm or more.

Further, a size (pattern width) of the colored pattern (colored pixel) is preferably 2.5 µm or less, more preferably 2.0 µm or less, and still more preferably 1.7 µm or less. A lower limit thereof can be, for example, 0.1 µm or more, and can also be 0.2 µm or more.

<Image Display Device>

A cured film (color filter, light-shielding film, or the like) formed with the curable composition of the present invention can be used in an image display device such as a liquid crystal display device and an organic electroluminescence display device.

Definitions of display devices and details of the respective display devices are described, for example, in "Electronic Display Devices (edited by Akio, SASAKI, published by Kogyo Chosakai Publishing Co., Ltd., 1990)", "Display Devices (edited by Toshiyuki, IBUKI, published by Sangyo Tosho Publishing Co., Ltd., 1989)", and the like. In addition, liquid crystal display devices are described, for example, in "Next Generation Liquid Crystal Display Technology (edited by Tatsuo UCHIDA, published by Kogyo Chosakai Publishing Co., Ltd., 1994)". The liquid crystal display devices to which the present invention can be applied are not particularly limited, and for example, the present invention can be applied to the liquid crystal display devices of various modes that are described in the above "Next Generation Liquid Crystal Display Technology".

The color filter in the present invention may be used for a color thin film transistor (TFT) mode liquid crystal display devices. The color TFT mode liquid crystal display devices are described, for example, in "Color TFT Liquid Crystal Display (published by KYORITSU SHUPPAN CO., LTD, 1996). Furthermore, the present invention can be applied to liquid crystal display devices having a widened viewing angle that employ a lateral electric field driving mode such as in plane switching (IPS), a pixel division mode such as multi-domain vertical alignment (MVA), and a super-twist nematic (STN), a twisted nematic (TN), a vertical alignment (VA), an on-chip spacer (OCS), a fringe field switching (FFS), a reflective optically compensated bend (R-OCB), and the like.

Further, the color filter in the present invention can also be provided in a color-filter on array (COA) mode that is bright and has high-definition. In a liquid crystal display device of the COA mode, in addition to the ordinary required characteristics as described above, required characteristics for the color filter may require characteristics required for an interlayer dielectric film, that is, low dielectric constant and remover liquid resistance. Since the color filter of the present invention is excellent in light fastness and the like, it is possible to provide a COA mode liquid crystal display device having high resolution and excellent long-term durability. In order to satisfy the required characteristics of low dielectric constant, a resin coating film may be provided on the color filter layer.

Such image display modes are described, for example, at page 43 of "EL, PDP, and LCD Display Technology and Recent Trends of the Market (TORAY RESEARCH CENTER, research and study department, 2001)".

Further, the color filter may have a structure in which a cured film forming each color pixel is embedded in a space, for example, partitioned in a lattice shape by a partition wall. In this case, the partition wall preferably has a low refractive index with respect to each color pixel. Examples of an imaging device having such a structure include devices described in JP2012-227478A and JP2014-179577 A.

The liquid crystal display device is configured to have various members such as an electrode substrate, a polarizing film, a phase difference film, a backlight, a spacer, and a viewing angle compensation film, in addition to the color filter of the present invention. The color filter of the present invention can be applied to liquid crystal display devices configured to have such known members. These members are described, for example, in "'94 Market for Liquid Crystal Display Related Materials and Chemicals (Kentaro, SHIMA, published by CMC Publishing CO., LTD., 1994)" and "2003 Current Situation of Liquid Crystal-Related Market and Future Prospects ($2^{nd}$ volume) (Yoshikichi HYO, published by Fuji Chimera Research Institute, Inc., 2003)".

The backlight is described in SID meeting Digest 1380 (2005) (A. Konno et al.), Display (monthly publication), December, 2005, pages 18 to 24 (Yasuhiro, SHIMA) and pages 25 to 30 (Takaaki HACHIKI), and the like.

EXAMPLES

Hereinafter, the present invention will be described in more detail based on examples. Materials, amounts used, proportions, treatment details, treatment procedures, and the like as shown in the following examples can be appropriately changed without departing from the gist of the present invention. Therefore, a scope of the present invention should not be interpreted restrictively by the following examples.

[Preparation of Dispersion Composition]
[Pigment]
<Preparation of Pigment>
-Production of Titanium Black A-1-
100 g of titanium oxide MT-150A (trade name: manufactured by Tayca Corporation) having an average particle diameter of 15 nm, 25 g of silica particles AEROPERL® 300/30 (manufactured by Evonik) having a BET surface area of 300 m²/g, and 100 g of dispersant Disperbyk 190 (trade name: manufactured by BYK Co., Ltd.) were weighed and added to 71 g of ion exchange water. Thereafter, using a MAZERSTAR KK-400W manufactured by KURABO, the mixture was treated at an orbital rotation speed of 1,360 rpm and a spin rotation speed of 1,047 rpm for 20 minutes to obtain a mixture aqueous solution. A quartz container was filled with this aqueous solution and heated to 920° C. in an oxygen atmosphere using a small rotary kiln (manufactured by Motoyama Corporation). Thereafter, the atmosphere inside the small rotary kiln was replaced with nitrogen, and nitriding reduction treatment was performed by flowing ammonia gas into the small rotary kiln at 100 mL/min for 5 hours at the same temperature. After completion, collected powders were pulverized in a mortar to obtain powdery titanium black A-1 containing Si atoms [dispersed body containing titanium black particles and Si atoms. Specific surface area: 73 m²/g].

(A-2) Titanium powder TIE14PB, High Purity Laboratory Co., Ltd.

(A-3) Commercial product purchased from New Metals and Chemicals Corporation, Ltd., TiN grade B (A-4) Black pigment was manufactured according to JP05875179B without using Ag. Ti particles: Titanium powder TC-200 manufactured by Tohoh Tech Co., Ltd., supply speed set to 10 m/s.

(A-5) Carbon black (Pigment Black 7) with an average primary particle diameter of 15 nm (A-6) C.I. Pigment Red 254/C.I. Pigment Yellow 139/C.I. Pigment Blue 15:6/Pigment Violet 23

(A-7) C.I. Pigment Yellow 139/Pigment Violet 23

(A-8) C.I. Pigment Red 254/C.I. Pigment Yellow 139

(A-9) C.I. Pigment Green 58/C.I. Pigment Yellow 139

(A-10) C.I. Pigment Blue 15:6/Pigment Violet 23

(A-11) Commercial product purchased from New Metals and Chemicals Corporation, Ltd., TiN grade B/Carbon black (Pigment Black 7) with an average primary particle diameter of 15 nm (A-12) Commercial product purchased from New Metals and Chemicals Corporation, Ltd., TiN grade B/C.I. Pigment Yellow 139

In the above (A-6), the pigments were mixed and used so that a pigment ratio thereof was 1:1:1:1 (mass ratio). In addition, in (A-7) to (A-10), the pigments were mixed and used so that each pigment ratio thereof was 1:1 (mass ratio).

[Dispersant]

(B-1): Specific Resin 1 having the following structure

Specific Resin 1 was obtained according to the manufacturing method of paragraph numbers <0338> to <0340> of JP2010-106268A.

In the formula of the Specific Resin 1, x was 90% by mass, y was 0% by mass, and z was 10% by mass.

Further, the Specific Resin 1 had a weight average molecular weight of 40,000, an acid value of 100 mg KOH/g, and the number of atoms of a graft chain (excluding hydrogen atoms) of 117.

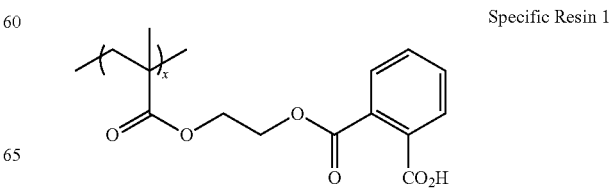

Specific Resin 1

-continued

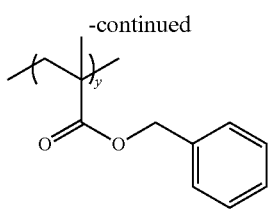

CLogP: 2.57

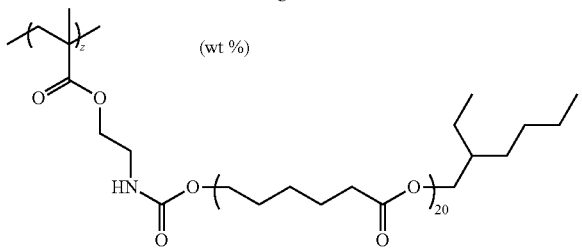
(wt %)

(B-2): Exemplary Compound 71 described in JP2010-106268A, the following structure (Exemplary Compound 71)

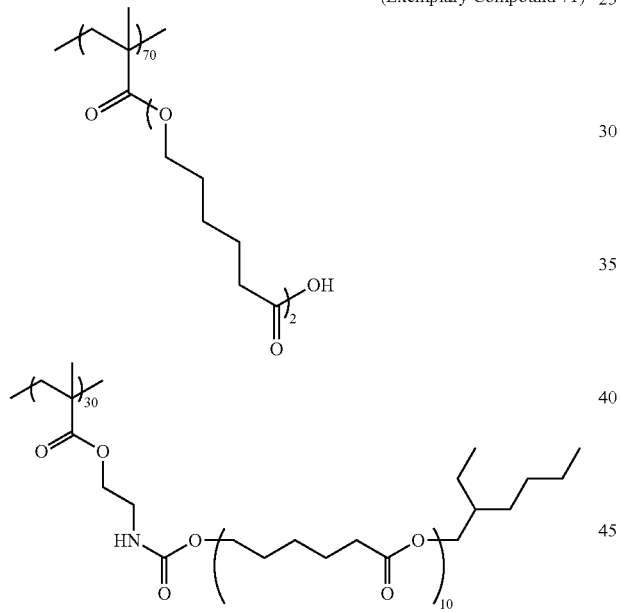

(B-3): Resin (J-1) described in JP2010-6932A, the following structure

Resin (J-1)

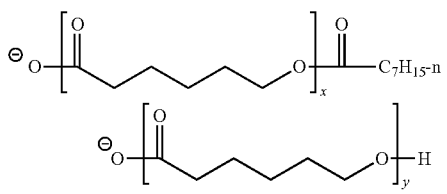

(B-4): Disperbyk 111 (manufactured by BYK Co., Ltd.)
(B-5): Solspers 36000 (manufactured by Lubrizol)
[Solvent]
(C-1) Propylene glycol monomethyl ether acetate/butyl acetate/cylopentanone=1/2/2
(C-2) Propylene glycol monomethyl ether acetate/butyl acetate/cyclohexanone=1/2/2
(C-3) Propylene glycol monomethyl ether acetate/butyl acetate/cyclohexyl acetate=1/2/2
(C-4) Propylene glycol monomethyl ether acetate/butyl acetate=3/2 (C-5) Propylene glycol monomethyl ether acetate
[Additives]
<Synthesis of (D-1)>

ε-caprolactone (600 g) and 2-ethyl-1-hexanol (22.8 g) were introduced into a 1,000 mL three-neck flask and the mixture was stirred while blowing nitrogen. Monobutyltin oxide (0.1 g) was added to the mixture and the mixture was heated to 100° C. After 8 hours, disappearance of the raw material was confirmed by gas chromatography, and then the mixture was cooled to 80° C. Subsequently, 2,6-di-t-butyl-4-methylphenol (0.1 g) was added to the mixture and 2-methacryloyloxyethyl isocyanate (27.2 g) was further added to the mixture. After stirring the mixture for 5 hours, disappearance of the raw material was confirmed by $^1$H-NMR (nuclear magnetic resonance), and then the mixture was cooled to room temperature to obtain a mixture of a compound represented by General Formula (1) (a=5, m=3 to 40) and a compound represented by General Formula (2) (b=5, n=3 to 40). The mixture was separated by column chromatography to obtain D-1: a compound represented by General Formula (1) (a=5, m=20), molecular weight: 2,280. Whether or not the compound was D-1 was confirmed by GPC mass spectrometry.

Further, as terminal structures thereof, it was confirmed that $R^1$ is an amino group and $R^2$ is a 2-ethylhexyl group.

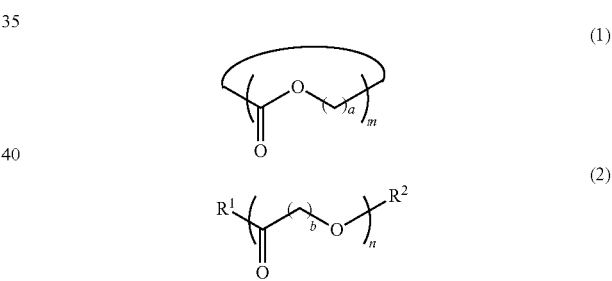

Synthesis of (D-2) to (D-8)

(D-2): The above mixture was separated by column chromatography to obtain (D-2) (a compound represented by General Formula (1) (a=5, m=5) molecular weight: 570) in a similar manner to (D-1).

(D-3): The above mixture was separated by column chromatography to obtain (D-3) (a compound represented by General Formula (1) (a=5, m=9) molecular weight: 1,026) in a similar manner to (D-1).

(D-4): The above mixture was separated by column chromatography to obtain (D-4) (a compound represented by General Formula (1) (a=5, m=30) molecular weight: 3,420) in a similar manner to (D-1).

(D-5): The above mixture was separated by column chromatography to obtain (D-5) (a compound represented by General Formula (2) (b=5, n=3) molecular weight: 472) in a similar manner to (D-1).

(D-6): The above mixture was separated by column chromatography to obtain (D-6) (a compound represented by General Formula (2) (b=5, n=5) molecular weight: 700) in a similar manner to (D-1).

(D-7): The above mixture was separated by column chromatography to obtain (D-7) (a compound represented by General Formula (2) (b=5, n=20) molecular weight: 2,410) in a similar manner to (D-1).

(D-8): The above mixture was separated by column chromatography to obtain (D-8) (a compound represented by General Formula (2) (b=5, n=30) molecular weight: 3,550) in a similar manner to (D-1).

Further, in the respective compounds (D-1) to (D-8), (total of molecular weights of structural units having ester structure)/(entire molecular weight) was such that (D-1) to (D-4) are 100% by weight, and (D-5) to (D-8) are 76.1% by mass, 83.9% by mass, 95.3% by mass, and 96.8% by mass, respectively.

[Preparation of Dispersion Composition]

Example 1

(Preparation of Dispersion)
A mixture (composition A) of the following components was mixed using a stirrer (EUROSTAR manufactured by IKA Corporation) for 15 minutes to obtain a dispersion.
(Composition A)
Pigment (A-1) . . . 11.79 parts by mass
30% by mass solution of dispersant (B-1) in propylene glycol monomethyl ether acetate . . . 11.79 parts by mass
Solvent (C-1) . . . 23.58 parts by mass
The obtained dispersion was subjected to a dispersion treatment using Ultra Apex Mill UAM 015 manufactured by Kotobuki Industries, Ltd. under the following condition to obtain a dispersion.
(Dispersion Condition)
Bead diameter: ϕ 0.05 mm
Bead filling ratio: 75% by volume
Mill peripheral speed: 8 m/sec
Amount of mixed liquid to be dispersed: 500 g
Circulation flow rate (pump supply amount):13 kg/hour
Treatment liquid temperature: 25° C. to 30° C.
Cooling water: Tap water
Beads mill annular passage inner volume: 0.15 L
Number of passes: 90 passes
10 kg of the obtained dispersion was stored at −18° C. for 3 days and then stored at room temperature for 6 hours to return the dispersion to a normal temperature. Thereafter, capsule filtration was carried out using a nylon filter (manufactured by Pall Corporation) having a filter pore diameter of 0.45 μm.
To the obtained filtrated liquid, 0.155 parts by mass of additive (D-1) was added, so that dispersion composition 1 was obtained.

Examples 2 to 32 and Comparative Example 1

Dispersion compositions of Examples 2 to 32 and Comparative Example 1 were prepared in the same manner as in the preparation of the dispersion composition of Example 1 except that the components shown in Tables 1 to 8 were used.

[Evaluation]
The dispersion compositions of the examples and the comparative examples were subjected to the following evaluations.
<Storage Stability Evaluation 1: Spectral Change>
Each of the dispersion compositions prepared above was coated on a glass substrate by a spin coating method and then the glass substrate coated with the dispersion composition was heated on a hot plate at 100° C. for 2 minutes to obtain a coating film. With respect to the obtained coating film, an absorbance at a wavelength of 550 nm was measured with a spectrometer UV 3600 (manufactured by Shimadzu Corporation), and this was taken as an absorbance (i).

Separately from this, each of the dispersion compositions prepared above was placed in a 100 mL container made of glass, the container was sealed, and the container was allowed to stand at room temperature for 6 months. After the standing, the dispersion composition was sampled up to a depth of 2 cm from a liquid level in the container. Using the sampled dispersion composition, a coating film was formed in the same manner as above, an absorbance was measured, and this was taken as an absorbance (ii).

From the measured absorbances (i) and (ii), a rate of change in absorbance before and after the standing for 6 months was obtained and storage stability (temporal stability) of the dispersion composition was evaluated according to the following evaluation criteria. It can be said that smaller rate of change indicates better storage stability. Practically, A or B is preferable.

The rate of change (%) of absorbance is obtained by {(absorbance (i)−absorbance (ii))/absorbance (i)×100}.
(Evaluation Criteria)
"A": The rate of change in absorbance was less than 3%.
"B": The rate of change in absorbance was equal to or greater than 3% and less than 10%.
"C": The rate of change in absorbance was 10% or more.
The results are shown in Tables 1 to 8.
<Storage Stability Evaluation 2: Presence/Absence of Generation of Foreign Matters
50 g of the dispersion composition was placed in a 100 mL container made of glass, the container was sealed, and the container was allowed to stand at −20° C. for 3 days. After the standing, the dispersion composition was sampled up to a depth of 1 cm from a bottle bottom of the container. The sampled dispersion composition was coated on a glass substrate by a spin coating method, and then the glass substrate coated with the dispersion composition was heated on a hot plate at 100° C. for 2 minutes to obtain a coating film.
By observing a surface state of the coating film using an optical microscope MT-3600 LW (manufactured by FLOVEL), storage stability (presence or absence of generation of foreign matters) of the dispersion composition was evaluated. It can be said that smaller foreign matters indicates better storage stability. Practically, A or B is preferable.
(Evaluation Criteria)
"A": Foreign matters are not found in the coating film, and this is a level at which there is no problem in practical use.
"B": Foreign matters are found at several locations in the coating film, but there is no problem in practical use.
"C": Foreign matters are found at hundreds of locations in the coating film, but this is a level with locations which can be used practically.
"D": Foreign matters are found on the entire surface in the coating film, and this is a level with problem.
The results are shown in Tables 1 to 8.
In the tables, an "additive" means a "cyclic or chain-like polyester compound".
Further, an "addition amount" means a content (parts by mass) of the cyclic or chain-like polyester compound.
Further, the "amount with respect to entire mass of composition" means a content (% by mass) of the cyclic or chain-like polyester compound with respect to the entire mass of the dispersion composition.

Further, the "amount with respect to dispersant" means a content (% by mass) of the cyclic or chain-like polyester compound with respect to the dispersant.

TABLE 1

|  |  | Example 1 | Example 2 | Example 3 | Example 4 | Example 5 |
|---|---|---|---|---|---|---|
| Dispersion composition | Pigment | (A-1) | (A-1) | (A-1) | (A-1) | (A-1) |
|  | Dispersant | (B-1) | (B-1) | (B-1) | (B-1) | (B-1) |
|  | Solvent | (C-1) | (C-2) | (C-3) | (C-4) | (C-5) |
|  | Additive | (D-1) | (D-1) | (D-1) | (D-1) | (D-1) |
|  | Addition amount (parts by mass) | 0.155 | 0.155 | 0.155 | 0.155 | 0.155 |
|  | Amount (% by mass) with respect to entire mass of composition | 0.3 | 0.3 | 0.3 | 0.3 | 0.3 |
|  | Amount (% by mass) with respect to dispersant | 4.4 | 4.4 | 4.4 | 4.4 | 4.4 |
| Evaluation | Spectral change | A | A | A | A | A |
|  | Presence or absence of generation of foreign matters | A | B | B | B | B |

TABLE 2

|  |  | Example 6 | Example 7 | Example 8 |
|---|---|---|---|---|
| Dispersion composition | Pigment | (A-1) | (A-1) | (A-1) |
|  | Dispersant | (B-1) | (B-1) | (B-1) |
|  | Solvent | (C-1) | (C-1) | (C-1) |
|  | Additive | (D-2) | (D-3) | (D-4) |
|  | Addition amount (parts by mass) | 0.155 | 0.155 | 0.155 |
|  | Amount (% by mass) with respect to entire mass of composition | 0.3 | 0.3 | 0.3 |
|  | Amount (% by mass) with respect to dispersant | 4.4 | 4.4 | 4.4 |
| Evaluation | Spectral change | B | A | A |
|  | Presence or absence of generation of foreign matters | A | A | B |

TABLE 3

|  |  | Example 9 | Example 10 | Example 11 | Example 12 | Example 13 | Example 14 |
|---|---|---|---|---|---|---|---|
| Dispersion composition | Pigment | (A-2) | (A-3) | (A-4) | (A-5) | (A-6) | (A-7) |
|  | Dispersant | (B-1) | (B-1) | (B-1) | (B-1) | (B-1) | (B-1) |
|  | Solvent | (C-1) | (C-1) | (C-1) | (C-1) | (C-1) | (C-1) |
|  | Additive | (D-1) | (D-1) | (D-1) | (D-1) | (D-1) | (D-1) |
|  | Addition amount (parts by mass) | 0.155 | 0.155 | 0.155 | 0.155 | 0.155 | 0.155 |
|  | Amount (% by mass) with respect to entire mass of composition | 0.3 | 0.3 | 0.3 | 0.3 | 0.3 | 0.3 |
|  | Amount (% by mass) with respect to dispersant | 4.4 | 4.4 | 4.4 | 4.4 | 4.4 | 4.4 |
| Evaluation | Spectral change | A | A | A | A | A | A |
|  | Presence or absence of generation of foreign matters | A | A | A | A | A | A |

TABLE 4

|  |  | Example 15 | Example 16 | Example 17 | Example 18 | Example 19 |
|---|---|---|---|---|---|---|
| Dispersion composition | Pigment | (A-8) | (A-9) | (A-10) | (A-11) | (A-12) |
|  | Dispersant | (B-1) | (B-1) | (B-1) | (B-1) | (B-1) |
|  | Solvent | (C-1) | (C-1) | (C-1) | (C-1) | (C-1) |
|  | Additive | (D-1) | (D-1) | (D-1) | (D-1) | (D-1) |
|  | Addition amount (parts by mass) | 0.155 | 0.155 | 0.155 | 0.155 | 0.155 |
|  | Amount (% by mass) with respect to entire mass of composition | 0.3 | 0.3 | 0.3 | 0.3 | 0.3 |

TABLE 4-continued

|  |  | Example 15 | Example 16 | Example 17 | Example 18 | Example 19 |
|---|---|---|---|---|---|---|
| | Amount (% by mass) with respect to dispersant | 4.4 | 4.4 | 4.4 | 4.4 | 4.4 |
| Evaluation | Spectral change | A | A | A | A | A |
| | Presence or absence of generation of foreign matters | A | A | A | A | A |

TABLE 5

|  |  | Example 20 | Example 21 | Example 22 | Example 23 | Example 24 |
|---|---|---|---|---|---|---|
| Dispersion composition | Pigment | (A-1) | (A-1) | (A-1) | (A-1) | (A-1) |
| | Dispersant | (B-1) | (B-1) | (B-1) | (B-1) | (B-1) |
| | Solvent | (C-1) | (C-1) | (C-1) | (C-1) | (C-1) |
| | Additive | (D-1) | (D-1) | (D-1) | (D-1) | (D-1) |
| | Addition amount (parts by mass) | 0.016 | 0.078 | 0.62 | 0.74 | 6.0 |
| | Amount (% by mass) with respect to entire mass of composition | 0.03 | 0.17 | 1.3 | 1.5 | 11.3 |
| | Amount (% by mass) with respect to dispersant | 0.45 | 2.2 | 17.5 | 20.9 | 170.0 |
| Evaluation | Spectral change | B | B | A | A | B |
| | Presence or absence of generation of foreign matters | A | A | B | C | C |

TABLE 6

|  |  | Example 25 | Example 26 | Example 27 | Example 28 |
|---|---|---|---|---|---|
| Dispersion composition | Pigment | (A-1) | (A-1) | (A-10) | (A-1) |
| | Dispersant | (B-2) | (B-3) | (B-4) | (B-5) |
| | Solvent | (C-1) | (C-1) | (C-1) | (C-1) |
| | Additive | (D-1) | (D-1) | (D-1) | (D-1) |
| | Addition amount (parts by mass) | 0.155 | 0.155 | 0.155 | 0.155 |
| | Amount (% by mass) with respect to entire mass of composition | 0.3 | 0.3 | 0.3 | 0.3 |
| | Amount (% by mass) with respect to dispersant | 4.4 | 4.4 | 4.4 | 4.4 |
| Evaluation | Spectral change | A | A | A | A |
| | Presence or absence of generation of foreign matters | A | A | A | A |

TABLE 7

|  |  | Comparative Example 1 |
|---|---|---|
| Dispersion composition | Pigment | (A-1) |
| | Dispersant | (B-1) |
| | Solvent | (C-1) |
| | Additive | — |
| | Addition amount (parts by mass) | Absent |
| | Amount (% by mass) with respect to entire mass of composition | — |
| | Amount (% by mass) with respect to dispersant | — |
| Evaluation | Spectral change | C |
| | Presence or absence of generation of foreign matters | D |

TABLE 8

|  |  | Example 29 | Example 30 | Example 31 | Example 32 |
|---|---|---|---|---|---|
| Dispersion composition | Pigment | (A-1) | (A-1) | (A-1) | (A-1) |
| | Dispersant | (B-1) | (B-1) | (B-1) | (B-1) |
| | Solvent | (C-1) | (C-1) | (C-1) | (C-1) |
| | Additive | (D-5) | (D-6) | (D-7) | (D-8) |
| | Addition amount (parts by mass) | 0.155 | 0.155 | 0.155 | 0.155 |
| | Amount (% by mass) with respect to entire mass of composition | 0.3 | 0.3 | 0.3 | 0.3 |
| | Amount (% by mass) with respect to dispersant | 4.4 | 4.4 | 4.4 | 4.4 |
| Evaluation | Spectral change | B | A | A | A |
| | Presence or absence of generation of foreign matters | A | A | A | B |

From the results of Tables 1 to 8, it was confirmed that the dispersion compositions of Examples 1 to 32 are excellent in storage stability (suppression of spectral change, suppression of generation of foreign matters).

Further, by comparison of Examples 1 to 5, it was found that in a case where a solvent having a cyclic structure is used, storage stability (in particular, suppression of generation of foreign matters) is more excellent.

Further, by comparison of Example 1 and Examples 6 to 8, it was found that in a case where the cyclic polyester compound has a molecular weight of 600 to 3,000 (preferably 1,000 to 3,000, and more preferably 1,000 to 2,500), storage stability (in particular, suppression of spectral change) is more excellent.

Further, by comparison of Examples 29 to 32, it was found that in a case where the chain-like polyester compound has a molecular weight of 500 to 3,000 (preferably 1,000 to 3,000, and more preferably 1,000 to 2,500), storage stability (in particular, suppression of spectral change) is more excellent. In addition, it was found that in a case where a content of structural units having an ester structure is 80% by mass or more (preferably 85% by mass or more, more preferably 90% by mass or more, and still more preferably 95% by mass or more) with respect to the entire structural units, storage stability (in particular, suppression of generation of foreign matters) is more excellent.

Further, by comparison of Example 1 and Examples 20 to 24, it was found that in a case where a content of the cyclic or chain-like polyester compound is 0.001% to 5% by mass (preferably 0.001% to 1.5% by mass, more preferably 0.01% to 1.5% by mass, and still more preferably 0.2% to 1.5% by mass) with respect to the entire mass of the dispersion composition, storage stability (in particular, suppression of spectral change) is more excellent. In addition, it was found that in a case where a content of the cyclic or chain-like polyester compound is 0.005% to 20% by mass (preferably 0.005% to 10% by mass, more preferably 0.005% to 5% by mass, and still more preferably 0.1% to 3% by mass), with respect to the dispersant, storage stability (in particular, suppression of generation of foreign matters) is more excellent.

On the other hand, in the dispersion composition of the comparativeexample, insufficient storage stability was exhibited.

[Preparation of Curable Composition]

Example 33

Preparation of Curable Composition 1

A curable composition 1 was obtained by mixing the following components.

Dispersion composition prepared in Example 1—73.00 parts by mass

Alkali-soluble resin: Acrycure-RD-F8 (Nippon Shokubai Co., Ltd., solid content 40%, solvent: propylene glycol monomethyl ether)—8.32 parts by mass Polymerization initiator: Irgacure OXE 02 (manufactured by BASF Japan)—1.96 parts by mass Polymerizable compound: KAYARAD DPHA (trade name: manufactured by Nippon Kayaku Co., Ltd., mixture of hexafunctional polymerizable compound (amount of ethylenically unsaturated group: 10.4 mmol/g) and pentafunctional polymerizable compound (amount of ethylenically unsaturated group: 9.5 mmol/g))—6.82 parts by mass Surfactant: Mixture represented by the chemical formulas as described later was used (weight average molecular weight (Mw)=14,000)—0.02 parts by mass Solvent: Propylene glycol monomethyl ether acetate—7.82 parts by mass Comparative Example 2

Preparation of Curable Composition 2

A curable composition 2 was obtained by mixing the following composition.

Dispersion composition prepared in Comparative Example 1—73.00 parts by mass

Alkali-soluble resin: Acrycure-RD-F8 (Nippon Shokubai Co., Ltd., solid content 40%, solvent: propylene glycol monomethyl ether)—8.32 parts by mass Polymerization initiator: Irgacure OXE02 (manufactured by BASF Japan)—1.96 parts by mass Polymerizable compound: KAYARAD DPHA (trade name: manufactured by Nippon Kayaku Co., Ltd., mixture of hexafunctional polymerizable compound (amount of ethylenically unsaturated group: 10.4 mmol/g) and pentafunctional polymerizable compound (amount of ethylenically unsaturated group: 9.5 mmol/g))—6.82 parts by mass Surfactant: Mixture represented by the chemical formulas as described later was used (weight average molecular weight (Mw)=14,000)—0.02 parts by mass Solvent: Propylene glycol monomethyl ether acetate—7.82 parts by mass (Surfactant)

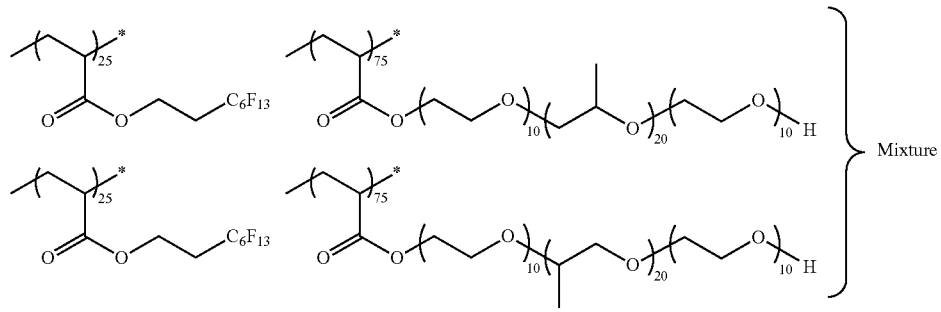

Example 34

Preparation of Curable Composition 3

A curable composition 3 was produced in the same manner as in the curable composition 1 except that the polymerization initiator was changed to NCI-831 (manufactured by ADEKA).

Example 35

Preparation of Curable Composition 4

A curable composition 4 was produced in the same manner as in the curable composition 1 except that the polymerization initiator was changed to compound I-1 having the following structure.

I-1

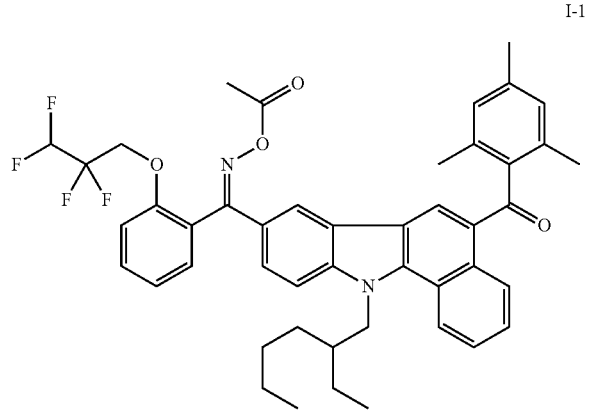 [SMILES: CCCCC(CC)Cn1c2ccc(/C(=N\OC(C)=O)c3ccccc3OCC(F)(F)C(F)F)cc2c2cc(C(=O)c3c(C)cc(C)cc3C)c3ccccc3c21]

Example 36

Preparation of Curable Composition 5

A curable composition 5 was produced in the same manner as in the curable composition 1 except that the polymerization initiator was changed to compound I-1/PEMP (manufactured by Nagase & Co., Ltd.)=1/1 (mass ratio).

Example 37

Preparation of Curable Composition 6

A curable composition 6 was produced in the same manner as in the curable composition 1 except that the alkali-soluble resin was changed to an acrylic copolymer (ratio of monomers used: benzyl methacrylate/methacrylate=70/30).

Example 38

Preparation of Curable Composition 7

A curable composition 7 was produced in the same manner as in the curable composition 1 except that the polymerizable compound was changed to urethane acrylate U-15HA (manufactured by Shin-Nakamura Chemical Co., Ltd.).

<Production of Light-Shielding Film>

50 g of the curable composition produced above was placed in a 100 mL container made of glass, the container was sealed, and the container was allowed to stand at −20° C. for 3 days. After the standing, the curable composition was sampled up to a depth of 1 cm from a bottle bottom of the container. After the sampled curable composition was coated on an 8-inch glass substrate by a spin coating method, the glass substrate coated with the curable composition was heat-treated (pre-baked.) for 120 seconds by using a hot plate at 100° C., and a coating film was obtained on the glass substrate. Subsequently, the coating film was exposed at an exposure amount of 1000 mJ/cm² in a linear pattern of 10 µm using an i-ray stepper exposure apparatus FPA-3000i5+ (manufactured by Canon Inc.). For the coating film after exposure, puddle development at 23° C. for 60 seconds was repeated five times using a 0.3% aqueous solution of tetramethylammonium hydroxide. Thereafter, the coating film was rinsed with a spin shower, and the coating film was further washed with pure water. Thereafter, a heat treatment (post-baking) was performed on the coating film, which had been subjected to the cleaning treatment, for 300 seconds by using a hot plate at 200° C. to form a light-shielding film having a linear pattern with a film thickness of 1 to 4 µm. Thereafter, a line width of the light-shielding film was measured at 255 points using an optical microscope MT-3600 LW (manufactured by FLOVEL) to calculate 3σ of the line width. As a result, 3σ of the light-shielding film produced using the curable compositions 1 and 3 to 7 was 1 µm or less, whereas in the light-shielding film produced using the curable composition 2, foreign matters were observed in a region where linearity was poor, and 3σ thereof was 5 µm or more.

[Application to Various Applications]

[Production and Evaluation of Light-Shielding Film for Wafer Level Lens]

By the following operation, a lens film was formed.

1 Formation of Thermosetting Cured Film

A curable composition for lens (composition obtained by adding 1% by mass of aryl sulfonium salt derivative (SP-172 manufactured by ADEKA CORPORATION) to an alicyclic epoxy resin (EHPE-3150 manufactured by Daicel Chemical Industries, Ltd.) (2 mL) was coated on a 5×5 cm glass substrate (thickness of 1 mm, manufactured by Schott, BK 7) and the coating film was cured by heating at 200° C. for 1 minute to form a film from which residues on a lens can be evaluated.

2. Evaluation on Lens

The curable composition 1 was coated on a glass wafer [support] on which the lens film was formed, and the support coated with the curable composition 1 was heated by a hot plate having a surface temperature of 120° C. for 120 seconds. In this way, a coating film [composition layer] having a film thickness of 2.0 µm was obtained.

<Exposure Step>

Subsequently, using a high-pressure mercury lamp, the obtained composition layer was exposed through a photomask having a hole pattern of 10 mm at an exposure amount of 500 mJ/cm².

<Developing Step>

Puddle development was carried out on the composition layer after the exposure using a 0.3% aqueous solution of tetramethylammonium hydroxide at a temperature of 23° C. for 60 seconds. Thereafter, the composition layer which had been subjected to the developing treatment was rinsed with a spin shower, and the composition layer which had been subjected to the rinsing treatment was washed with pure water to obtain a patterned light-shielding film.

[Production and Evaluation of Solid-State Imaging Device]

On the substrate on which the patterned light-shielding film produced in Example 33 was formed, a curable composition for lens (composition obtained by adding 1% by mass of aryl sulfonium salt derivative (SP-172 manufactured by ADEKA CORPORATION)) to an alicyclic epoxy resin (EHPE-3150 manufactured by Daicel Chemical Industries, Ltd.) was used to form a curable resin layer, and a shape was transferred thereto with a quartz mold having a lens shape and cured with a high-pressure mercury lamp at an exposure amount of 400 mJ/cm², so that a water level lens array having a plurality of wafer level lenses was produced.

The produced wafer level lens array was cut, and the obtained wafer level lens was used to produce a lens module. Thereafter, an imaging element and a sensor substrate were attached thereto to produce an imaging unit.

The obtained wafer level lens had good transmittance without residues at a lens opening. Also, for the light-shielding layer, high uniformity in a coating surface and high light-shielding properties were exhibited.

[Production of Color Filter Having Black Matrix]
[Formation of Black Matrix]

The curable composition 1 obtained above was coated on a glass wafer by a spin coating method and then the glass wafer coated with the curable composition 1 was heated on a hot plate at 120° C. for 2 minutes to obtain a coating film [composition layer]. A film thickness of the obtained coating film was 2.0 μm.

Subsequently, using an i-ray stepper, the obtained composition layer was exposed through a photomask having an island pattern with a pattern of 0.1 mm at an exposure amount of 500 mJ/cm².

Puddle development was carried out on the composition layer after the exposure using a 0.3% aqueous solution of tetramethylammonium hydroxide at a temperature of 23° C. for 60 seconds. Thereafter, the composition layer which had been subjected to the developing treatment was rinsed with a spin shower, and the composition layer which had been subjected to the rinsing treatment was washed with pure water to obtain a patterned light-shielding film (black matrix).

[Preparation of Chromatic Color Curable Composition]

Each of coloring curable composition R-1 for red (R), coloring curable composition G-1 for green (G), and coloring curable composition B-1 for blue (B) was prepared in the same manner as in curable composition 1, except that titanium black as a black pigment was replaced with each of the following chromatic color-based pigments.

~Chromatic Color-Based Pigments for Forming Colored Pixel of Each of RGB~

Pigment for red (R)
C.I. Pigment Red 254
Pigment for green (G)
30/70 (mass ratio) mixture of C.I. Pigment Green 36 and C.I. Pigment Yellow 219
Pigment for blue (B)
30/70 [mass ratio] mixture of C.I. Pigment Blue 15:6 and C.I. Pigment Violet 23

[Production of Color Filter]

Using the above coloring curable composition R-1 for red (R) in the above-produced black matrix, a red (R) colored pattern of 80×80 μm was formed in the same manner as the production method of the above-produced black matrix. Furthermore, similarly, in a sequential manner, a green (G) chromatic colored pattern was formed using the coloring curable composition G-1 for green (G) and a blue (B) chromatic colored pattern was formed using the coloring curable composition B-1 for blue (B), to produce a color filter having a black matrix for a liquid crystal display device.

EXPLANATION OF REFERENCES

2, 20, 30, 40: solid-state imaging device
3: CMOS sensor
4: circuit board
5: ceramic substrate
5a: opening
5b: inner wall surface
6: IR cut filter
7: taking lens
8: lens holder
9: holding cylinder
11, 21, 31, 41: light-shielding film (light-shielding layer)

What is claimed is:

1. A dispersion composition comprising:
   a pigment;
   a dispersant; and
   a cyclic or chain-like polyester compound,
   wherein the chain-like polyester compound is represented by General Formula (2),

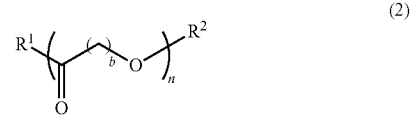

in General Formula (2), b represents an integer of 1 to 8, n represents an integer of 3 to 100, $R^1$ represents an amino group, and $R^2$ represents a monovalent organic group or a hydrogen atom.

2. The dispersion composition according to claim 1, further comprising a solvent.

3. The dispersion composition according to claim 2, wherein the cyclic polyester compound is represented by General Formula (1), and a content of the cyclic or chain-like polyester compound is 0.001% to 5% by mass with respect to the entire mass of the dispersion composition,

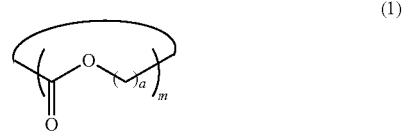

in General Formula (1), a represents an integer of 1 to 8, and m represents an integer of 3 to 100.

4. The dispersion composition according to claim 2, wherein the cyclic or chain-like polyester compound is contained in an amount of 0.005% to 20% by mass with respect to the dispersant.

5. The dispersion composition according to claim 2, wherein the solvent includes a solvent having a cyclic structure.

6. The dispersion composition according to claim 5, wherein the solvent is cyclopentanone.

7. The dispersion composition according to claim 1, wherein the cyclic or chain-like polyester compound has a molecular weight of equal to or greater than 500 and less than 4,000.

8. The dispersion composition according to claim 7, wherein the cyclic polyester compound is represented by General Formula (1), and a content of the cyclic or chain-like polyester compound is 0.001% to 5% by mass with respect to the entire mass of the dispersion composition,

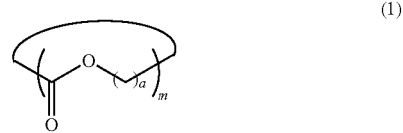

in General Formula (1), a represents an integer of 1 to 8, and m represents an integer of 3 to 100.

9. The dispersion composition according to claim 7,
wherein the cyclic or chain-like polyester compound is contained in an amount of 0.005% to 20% by mass with respect to the dispersant.

10. The dispersion composition according to claim 1,
wherein the cyclic or chain-like polyester compound contains a plurality of structural units having an ester structure, and a total of molecular weights of the plurality of structural units having an ester structure is 80% by mass or more with respect to the entire molecular weight.

11. The dispersion composition according to claim 10,
wherein the cyclic polyester compound is represented by General Formula (1), and a content of the cyclic or chain-like polyester compound is 0.001% to 5% by mass with respect to the entire mass of the dispersion composition,

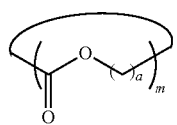
(1)

in General Formula (1), a represents an integer of 1 to 8, and m represents an integer of 3 to 100.

12. The dispersion composition according to claim 10,
wherein the cyclic or chain-like polyester compound is contained in an amount of 0.005% to 20% by mass with respect to the dispersant.

13. The dispersion composition according to claim 1,
wherein the cyclic polyester compound is represented by General Formula (1), and a content thereof of the cyclic or chain-like polyester compound is 0.001% to 5% by mass with respect to the entire mass of the dispersion composition,

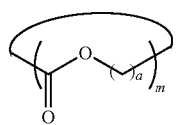
(1)

in General Formula (1), a represents an integer of 1 to 8, and m represents an integer of 3 to 100.

14. The dispersion composition according to claim 13,
wherein the cyclic or chain-like polyester compound is contained in an amount of 0.005% to 20% by mass with respect to the dispersant.

15. The dispersion composition according to claim 1,
wherein the cyclic or chain-like polyester compound is contained in an amount of 0.005% to 20% by mass with respect to the dispersant.

16. A curable composition comprising:
the dispersion composition according to claim 1;
a polymerizable compound; and
a polymerization initiator.

17. A light-shielding film comprising a cured film formed by using the curable composition according to claim 16.

18. A color filter having a colored pattern formed by using the curable composition according to claim 16.

19. A solid-state imaging device comprising a cured film formed by using the curable composition according to claim 16.

20. The dispersion composition according to claim 1,
wherein the chain-like polyester compound includes a structure of a ring-opened polymer of a lactone and an alcohol, and the lactone has 4 to 8 carbon atoms.

21. The dispersion composition according to claim 1,
wherein b represents an integer of 4 to 8.

22. The dispersion composition according to claim 1,
wherein the chain-like polyester compound includes a structure of a ring-opened polymer of a lactone and an alcohol, and the lactone is selected from the group consisting of caprolactone and valerolactone.

23. The dispersion composition according to claim 1,
wherein the chain-like polyester compound is a polymer containing a plurality of structural units having an ester structure, and the ester structure is derived from a lactone having 4 to 8 carbon atoms.

24. The dispersion composition according to claim 1,
wherein the chain-like polyester compound is a reaction product of a ring-opened polymer and 2-methacryloyloxyethyl isocyanate, and
the ring-opened polymer is a ring-opened polymer of ε-caprolactone and 2-ethyl-1-hexanol.

* * * * *